(12) United States Patent
Lee et al.

(10) Patent No.: US 12,713,586 B2
(45) Date of Patent: Aug. 18, 2026

(54) SEMICONDUCTOR DEVICE

(71) Applicant: SAMSUNG ELECTRONICS CO., LTD., Suwon-si (KR)

(72) Inventors: Kiseok Lee, Suwon-si (KR); Hyungeun Choi, Suwon-si (KR); Keunnam Kim, Suwon-si (KR); Jinwoo Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 450 days.

(21) Appl. No.: 18/236,501

(22) Filed: Aug. 22, 2023

(65) Prior Publication Data

US 2024/0266308 A1 Aug. 8, 2024

(30) Foreign Application Priority Data

Feb. 2, 2023 (KR) ........................ 10-2023-0014451

(51) Int. Cl.

| | |
|---|---|
| ***H10B 12/00*** | (2023.01) |
| ***H10W 20/41*** | (2026.01) |
| ***H10W 20/42*** | (2026.01) |
| *H10W 72/90* | (2026.01) |

(52) U.S. Cl.

CPC ......... *H10B 12/482* (2023.02); *H10B 12/315* (2023.02); *H10W 20/42* (2026.01); *H10W 20/435* (2026.01); *H10W 72/926* (2026.01); *H10W 72/944* (2026.01)

(58) Field of Classification Search

CPC .... H10B 12/315; H10B 12/482; H10B 12/00; H10B 12/50; H10B 12/033; H10B 12/485; H10B 12/488; H10B 12/31

See application file for complete search history.

(56) References Cited

U.S. PATENT DOCUMENTS

| | | | | |
|---|---|---|---|---|
| 10,269,808 | B2 | 4/2019 | Kim et al. | |
| 10,796,990 | B2 | 10/2020 | Chen et al. | |
| 11,251,186 | B2 | 2/2022 | Sharma et al. | |
| 11,282,816 | B2 | 3/2022 | Yu et al. | |
| 11,430,766 | B2 | 8/2022 | Liu et al. | |
| 2021/0013303 | A1 | 1/2021 | Chen et al. | |
| 2021/0265295 | A1* | 8/2021 | Liu | H10B 12/03 |
| 2022/0415896 | A1* | 12/2022 | Alzate-Vinasco | H10B 12/0335 |
| 2024/0098973 | A1* | 3/2024 | Liu | H10B 12/50 |

FOREIGN PATENT DOCUMENTS

| | | | |
|---|---|---|---|
| KR | 1020240028182 | A | 3/2024 |

* cited by examiner

*Primary Examiner* — Evan G Clinton

(74) *Attorney, Agent, or Firm* — Muir Patent Law, PLLC

(57) ABSTRACT

A semiconductor device includes a lower substrate, a lower dielectric structure on the lower substrate, a transistor between the lower substrate and the lower dielectric structure, a lower bonding pad in the lower dielectric structure, an upper dielectric structure on the lower dielectric structure, an upper substrate on the upper dielectric structure, a memory cell structure between the upper substrate and the upper dielectric structure, and an upper bonding pad in the upper dielectric structure. A top surface of the lower bonding pad is in contact with a bottom surface of the upper bonding pad. The lower bonding pad and the upper bonding pad overlap the memory cell structure.

19 Claims, 27 Drawing Sheets

FIG. 1A
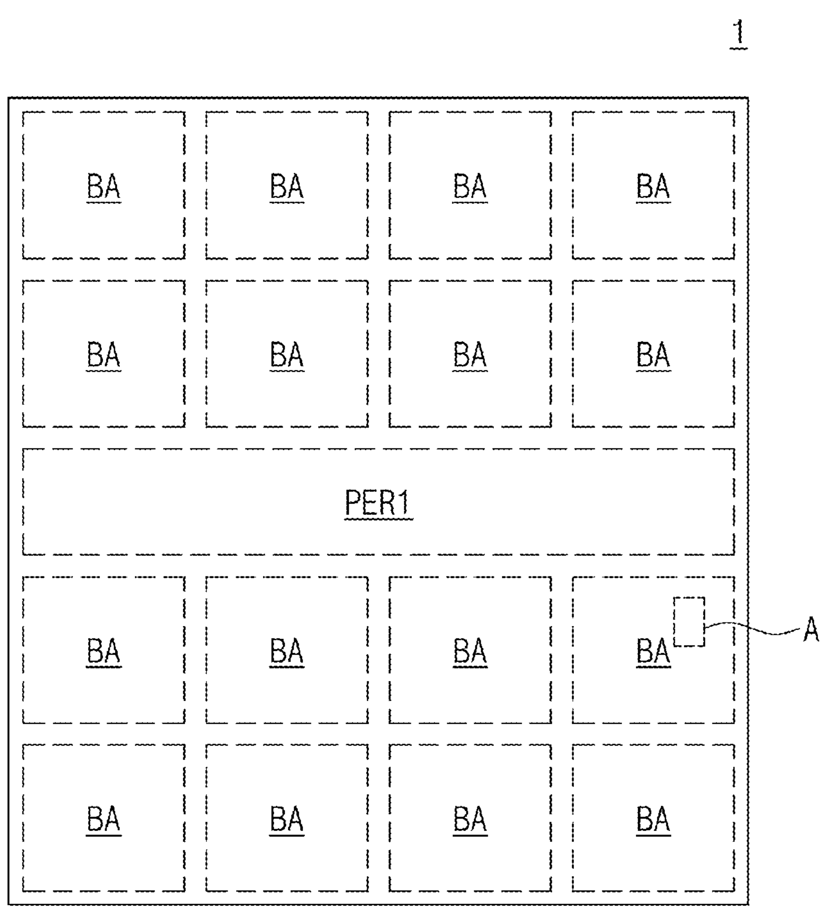
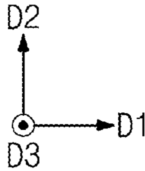

FIG. 1C
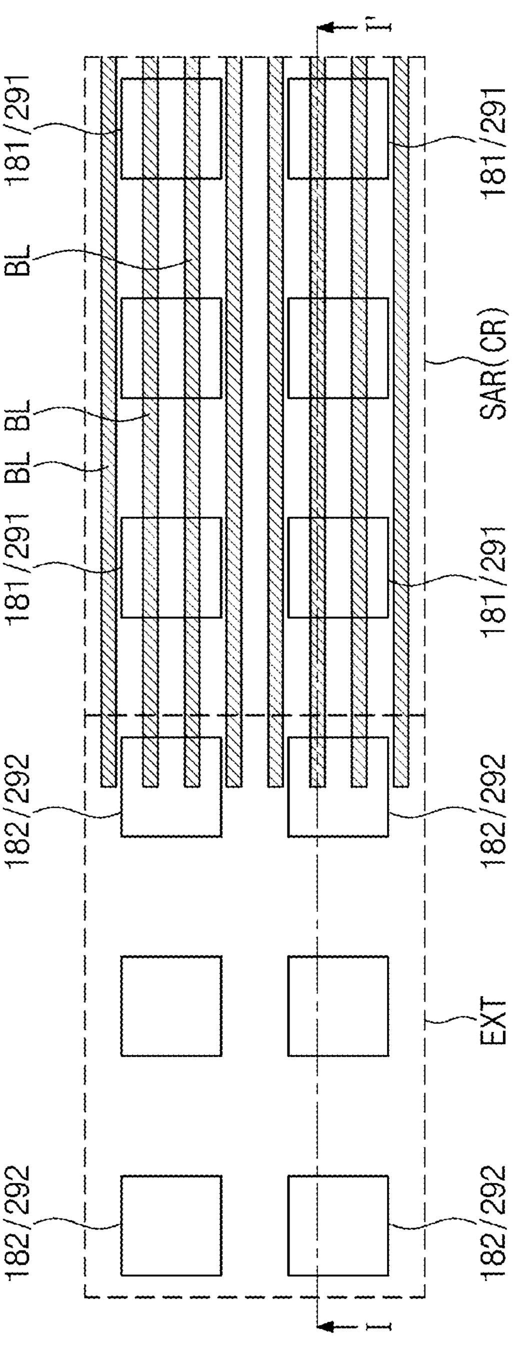
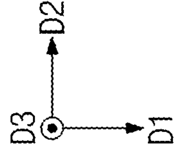

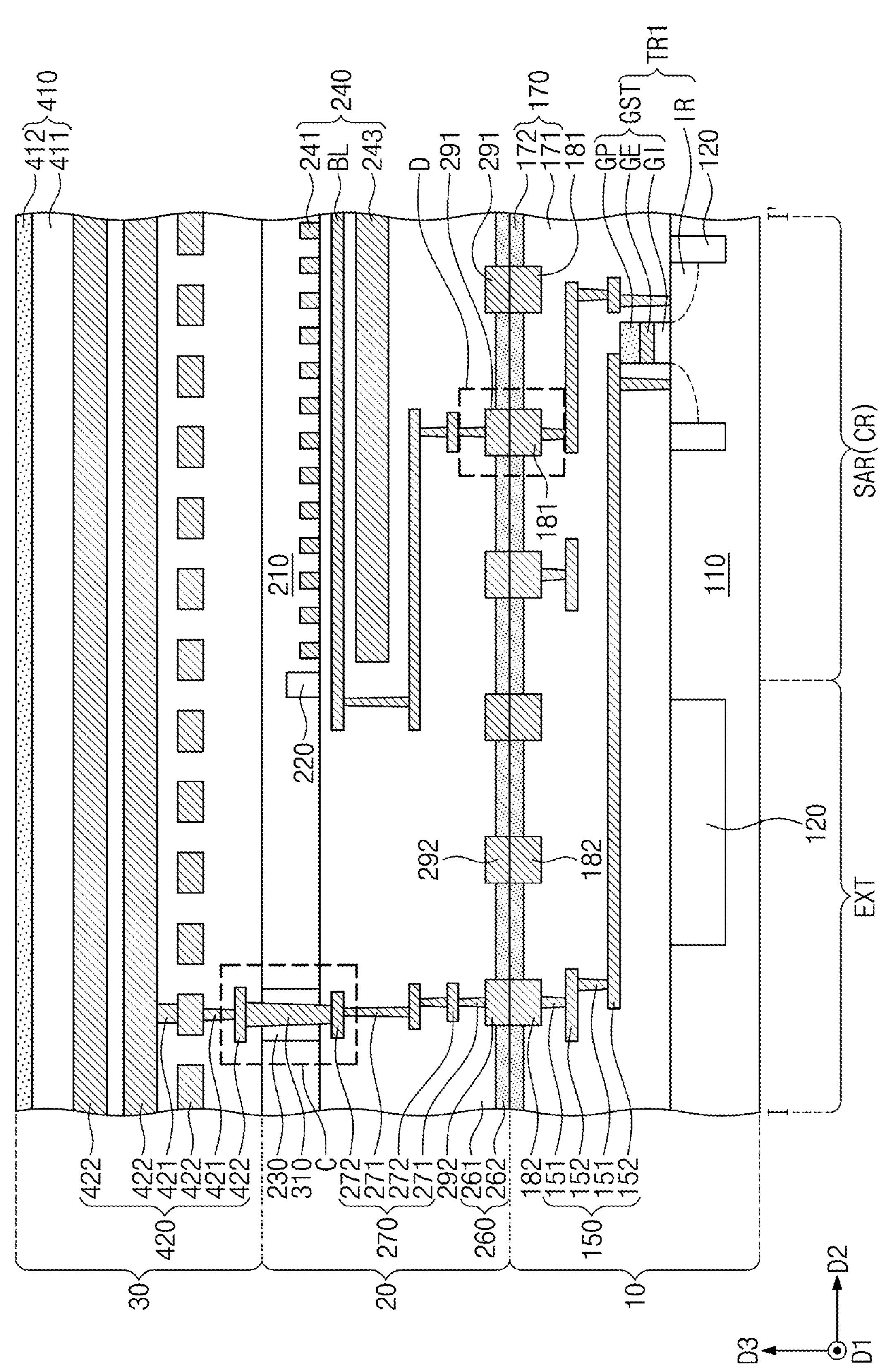

FIG. 2B
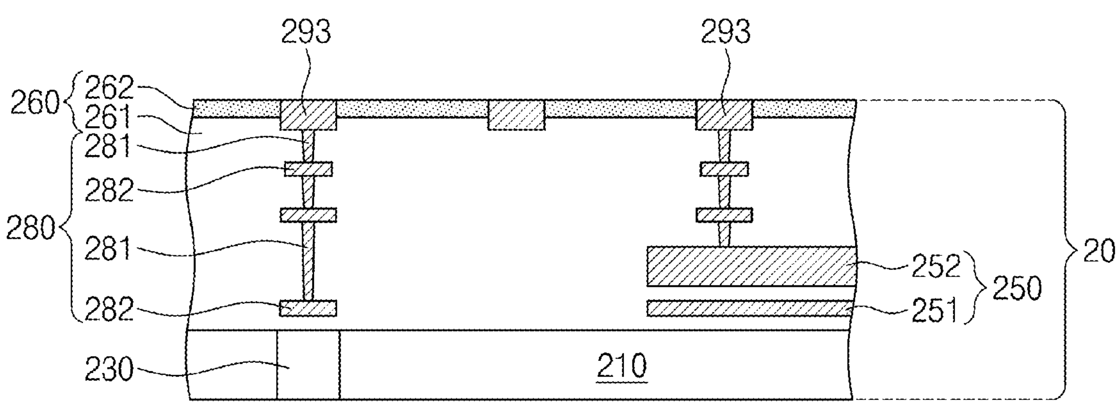
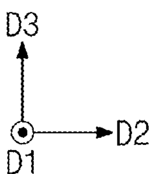

FIG. 3B
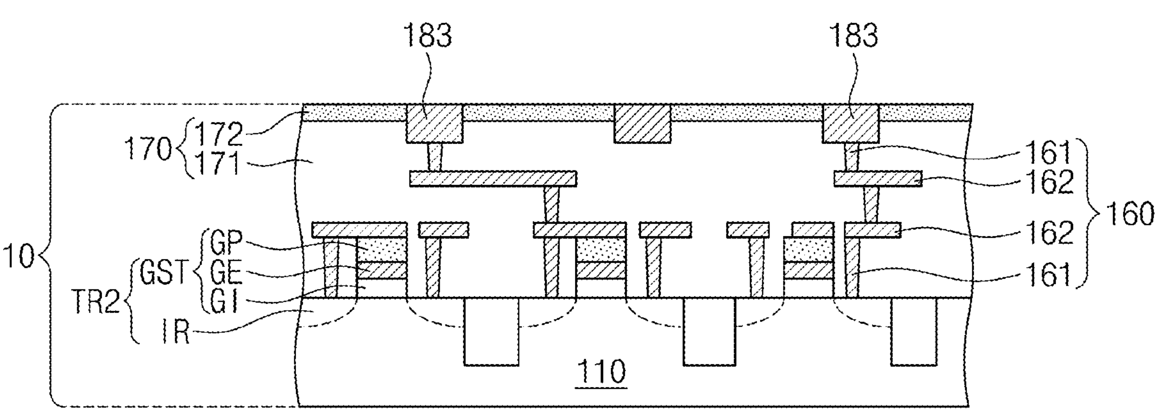
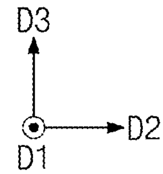

241
BL
243
240
291
291
172
171
170
181
GP
GE
GI
GST
TR1
IR
120
210
220
P411
292
182
181
110
120
230
310
272
271
272
271
292
261
262
260
182
151
152
151
152
150
20
10
D3
D2
D1

FIG. 4B
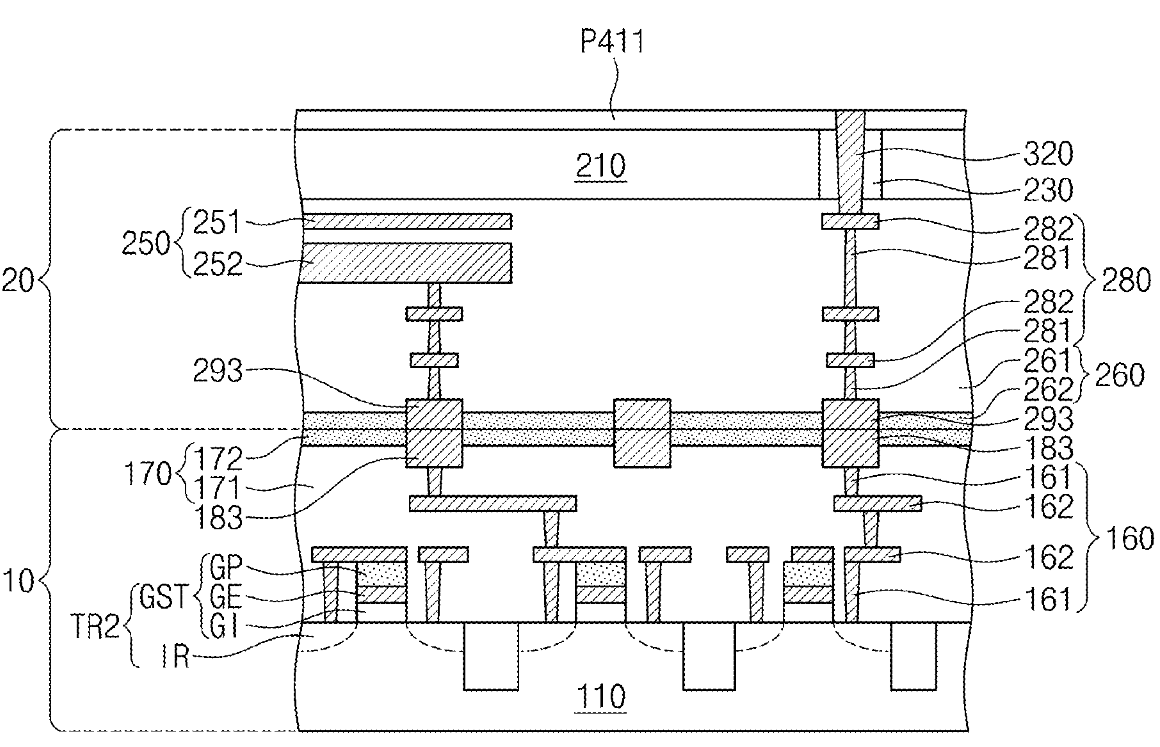
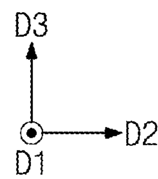

FIG. 9
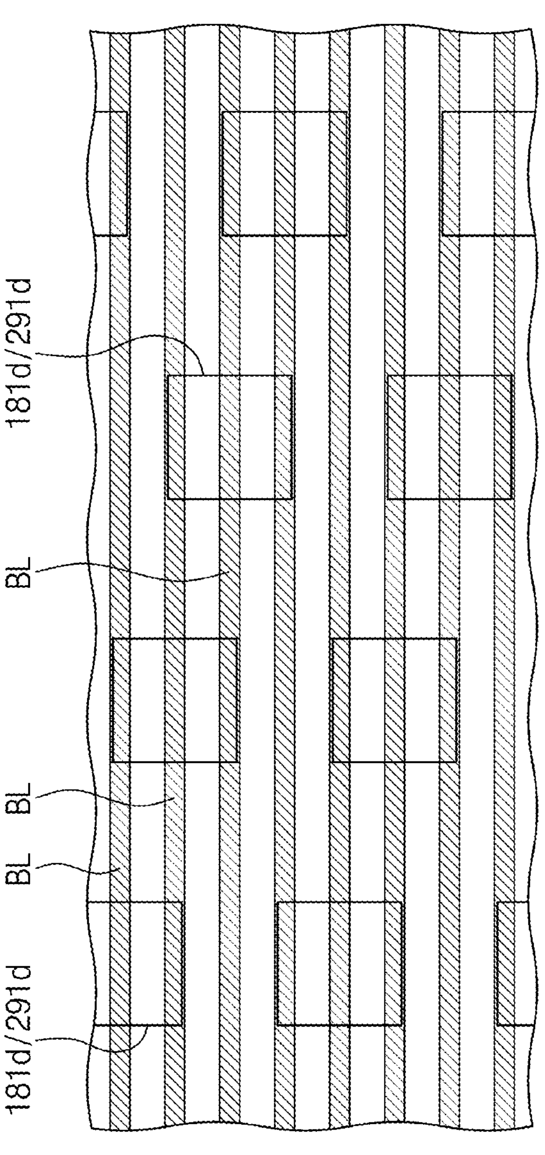
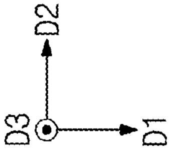

FIG. 10
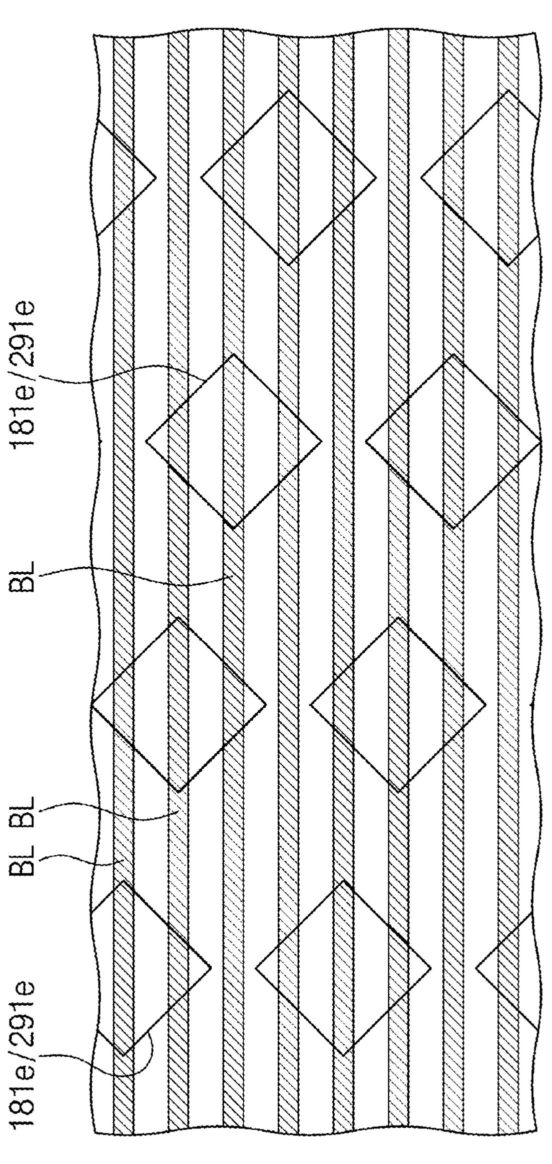
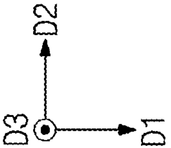

FIG. 11
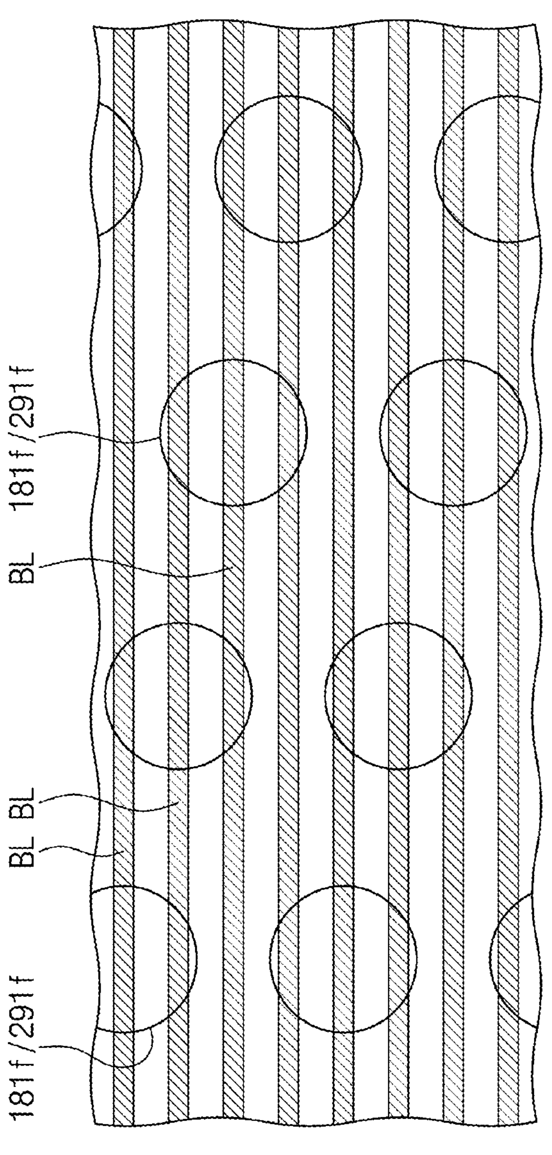
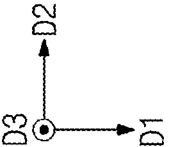

FIG. 13
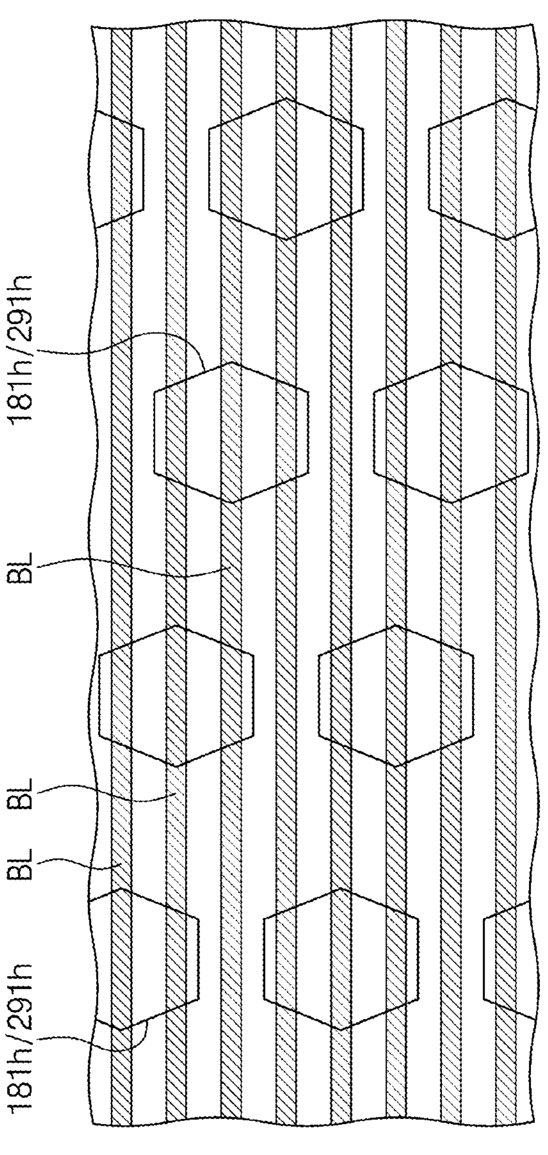
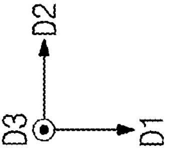

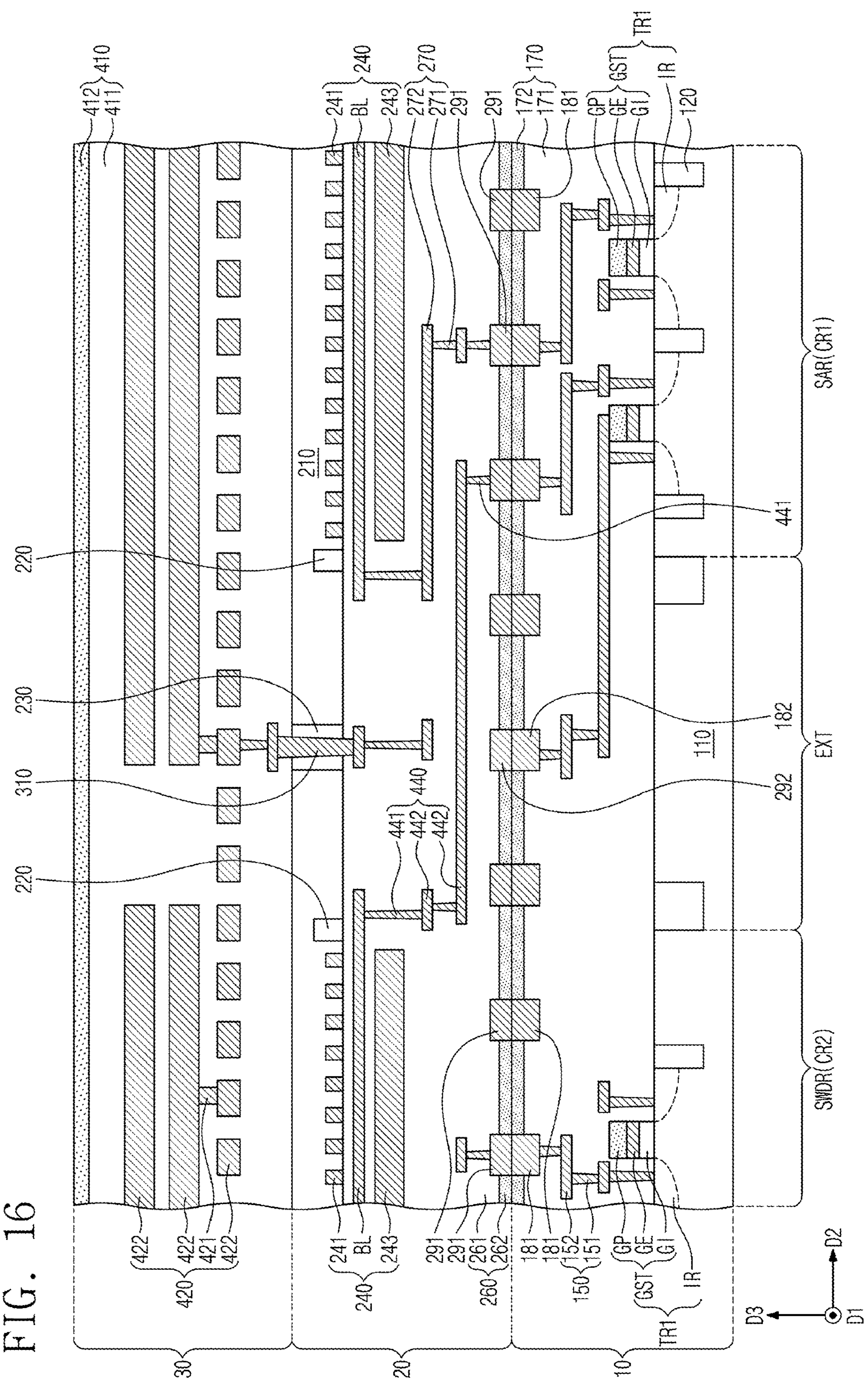

SEMICONDUCTOR DEVICE

CROSS-REFERENCE TO RELATED APPLICATION

This U.S. nonprovisional application claims priority under 35 U.S.C § 119 to Korean Patent Application No. 10-2023-0014451, filed on Feb. 2, 2023, in the Korean Intellectual Property Office, the disclosure of which is hereby incorporated by reference in its entirety.

BACKGROUND

1. Field

Embodiments relate to a semiconductor device, and more particularly, to a semiconductor device including a bonding pad.

2. Description of the Related Art

A semiconductor device may include an integrated circuit having a metal oxide semiconductor field effect transistors (MOSFETs). As size and design rule of the semiconductor device are gradually decreased, sizes of the MOSFETs are also increasingly scaled down. The scale down of the MOSFETs may deteriorate operating characteristics of the semiconductor device. Accordingly, research has been variously developed to manufacture a semiconductor device having excellent performances while overcoming limitations due to integration of the semiconductor device.

SUMMARY

According to some embodiments, a semiconductor device may include a lower substrate; a lower dielectric structure on the lower substrate; a transistor between the lower substrate and the lower dielectric structure; a lower bonding pad in the lower dielectric structure; an upper dielectric structure on the lower dielectric structure; an upper substrate on the upper dielectric structure; a memory cell structure between the upper substrate and the upper dielectric structure; and an upper bonding pad in the upper dielectric structure. A top surface of the lower bonding pad may be in contact with a bottom surface of the upper bonding pad. The lower bonding pad and the upper bonding pad may overlap the memory cell structure.

According to some embodiments, a semiconductor device may include a lower bonding structure that includes a lower substrate, a lower dielectric structure on the lower substrate, a first transistor between the lower substrate and the lower dielectric structure, and a first lower bonding pad in the lower dielectric structure; and an upper bonding structure that includes an upper dielectric structure on the lower dielectric structure, an upper substrate on the upper dielectric structure, a memory cell structure between the upper substrate and the upper dielectric structure, and a first upper bonding pad in the upper dielectric structure. The first lower bonding pad may be in contact with the first upper bonding pad. The first transistor may overlap the memory cell structure. The first transistor may be electrically connected to the memory cell structure through the first upper bonding pad and the first lower bonding pad.

According to some embodiments, a semiconductor device may include a lower substrate; a lower dielectric structure on the lower substrate; a transistor between the lower substrate and the lower dielectric structure; an upper dielectric structure on the lower dielectric structure; an upper substrate on the upper dielectric structure; a memory cell structure between the upper substrate and the upper dielectric structure, wherein the memory cell structure includes a bit line; a connection dielectric structure on the upper substrate; a connection conductive structure in the connection dielectric structure; a first lower bonding pad and a first upper bonding pad that electrically connect the transistor to the bit line, wherein the first lower bonding pad and the first upper bonding pad are in contact with each other; a second lower bonding pad and a second upper bonding pad that electrically connect the transistor to the connection conductive structure, wherein the second lower bonding pad and the second upper bonding pad are in contact with each other; and a through via that electrically connects the second upper bonding pad to the connection conductive structure. The through via may penetrate the upper substrate.

According to some embodiments, a method of fabricating a semiconductor device may include forming on an upper substrate a memory cell structure including a bit line; forming an upper dielectric structure that covers the memory cell structure; forming an upper bonding pad in the upper dielectric structure; forming a transistor on a lower substrate; forming a lower dielectric structure that covers the transistor; forming a lower bonding pad in the lower dielectric structure; and bonding the upper dielectric structure to the lower dielectric structure and bonding the upper bonding pad to the lower bonding pad. The upper bonding pad and the lower bonding pad may overlap the memory cell structure.

BRIEF DESCRIPTION OF DRAWINGS

Features will become apparent to those of skill in the art by describing in detail exemplary embodiments with reference to the attached drawings, in which:

FIG. 1A illustrates a plan view showing a semiconductor device according to some embodiments.

FIG. 1C illustrates an enlarged view showing section B of FIG. 1B.

FIG. 1D illustrates a cross-sectional view taken along line I-I' of FIG. 1C.

FIGS. 2A, 2B, 3A, 3B, 4A, and 4B illustrate cross-sectional views of stages in a method of fabricating a semiconductor device according to some embodiments.

FIG. 9 illustrates a plan view showing an arrangement of bonding pads in a semiconductor device according to some embodiments.

FIG. 10 illustrates a plan view showing an arrangement of bonding pads in a semiconductor device according to some embodiments.

FIG. 11 illustrates a plan view showing an arrangement of bonding pads in a semiconductor device according to some embodiments.

FIG. 13 illustrates a plan view showing an arrangement of bonding pads in a semiconductor device according to some embodiments.

FIG. 16 illustrates a cross-sectional view showing a semiconductor device according to some embodiments.

DETAILED DESCRIPTION

A semiconductor device according to some embodiments will be described hereinafter in conjunction with the accompanying drawings.

Figure 1B:
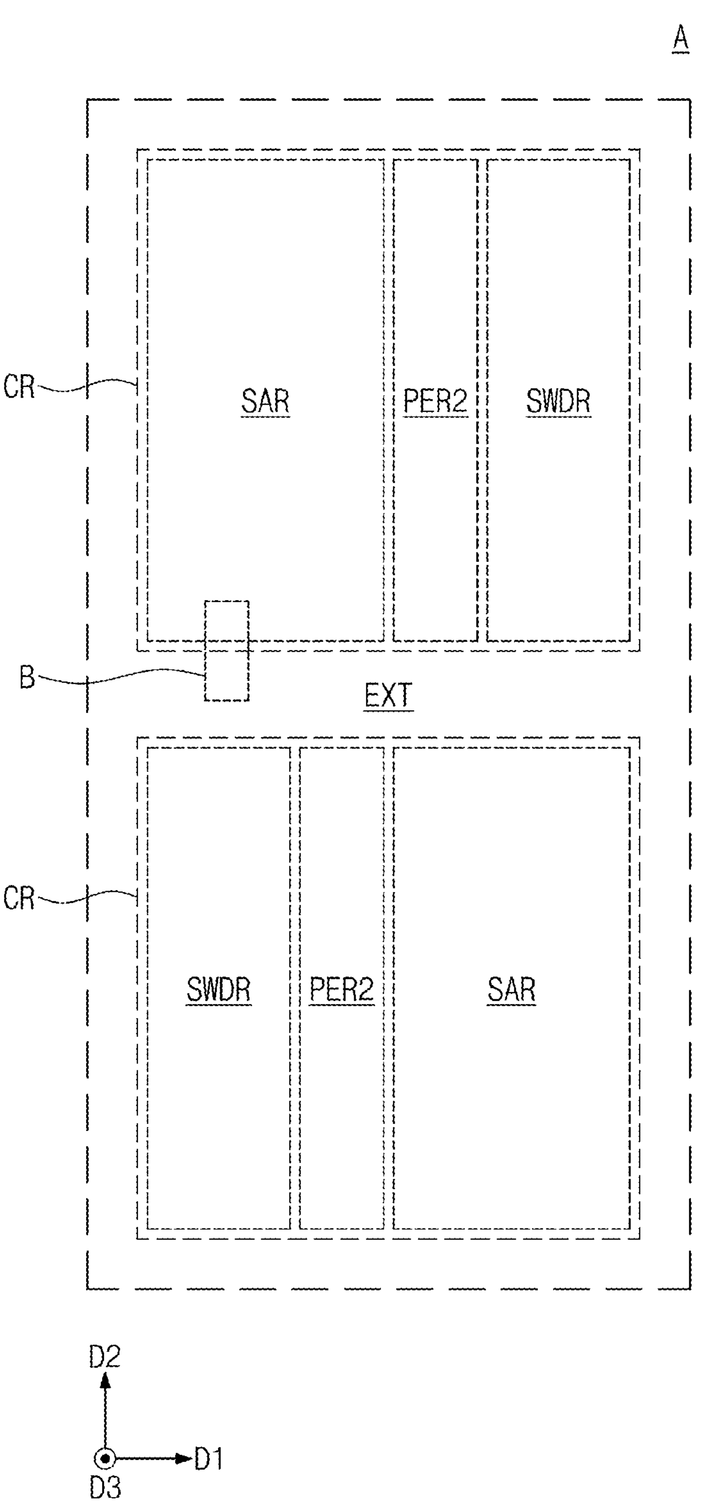
FIG. 1B illustrates an enlarged view showing section A of FIG. 1A.
Figure 1E:
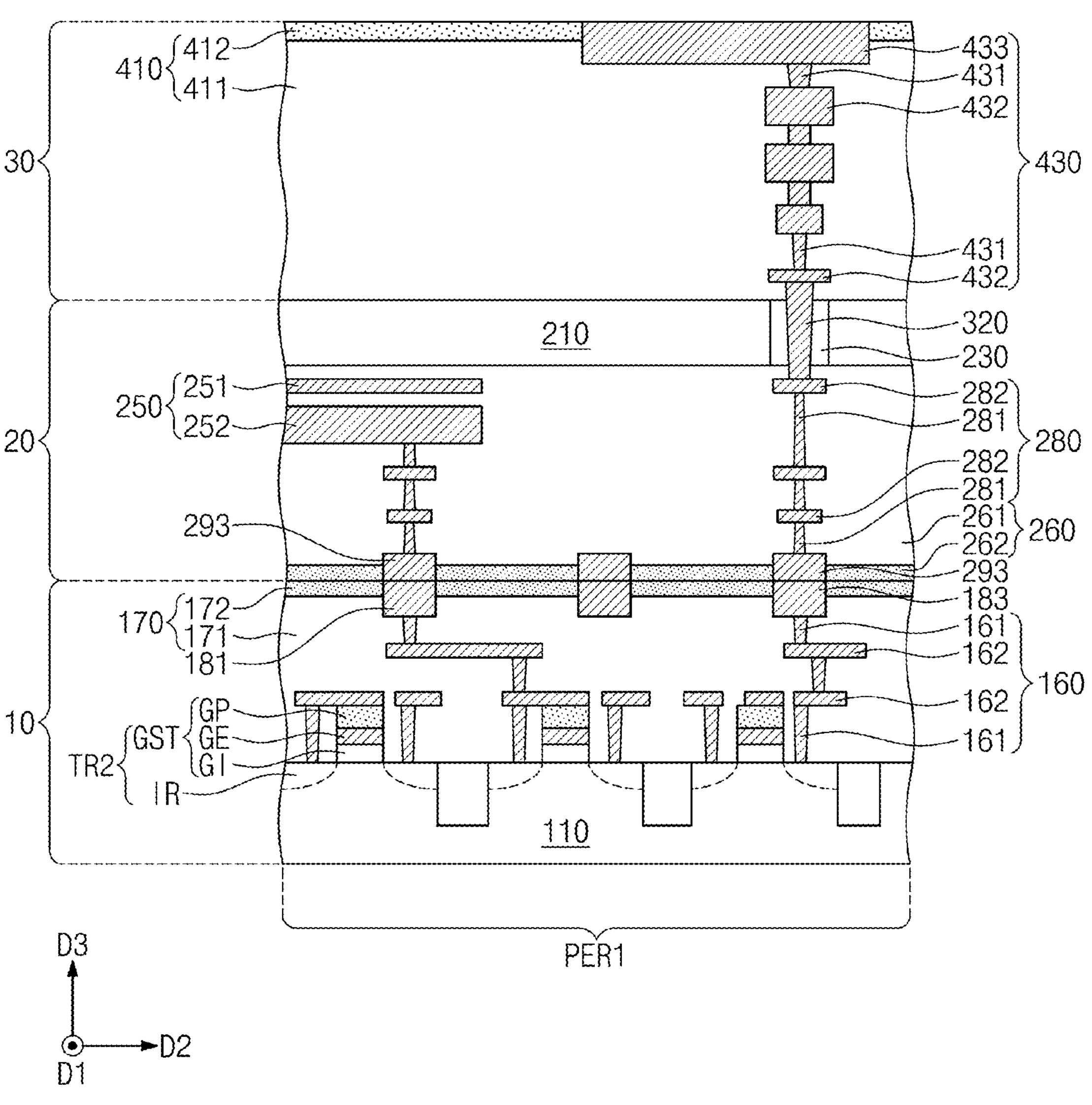
FIG. 1E illustrates a cross-sectional view of a first peripheral region of FIG. 1A.
Figure 1F:
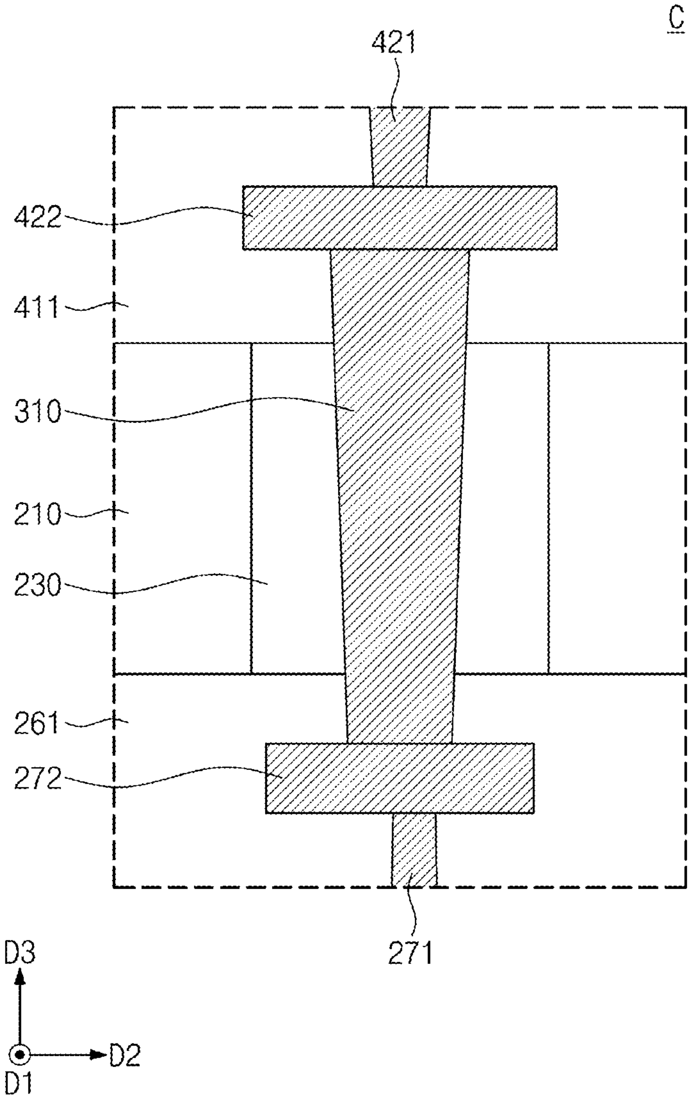
FIG. 1F illustrates an enlarged view showing section C of FIG. 1D.
Figure 1G:
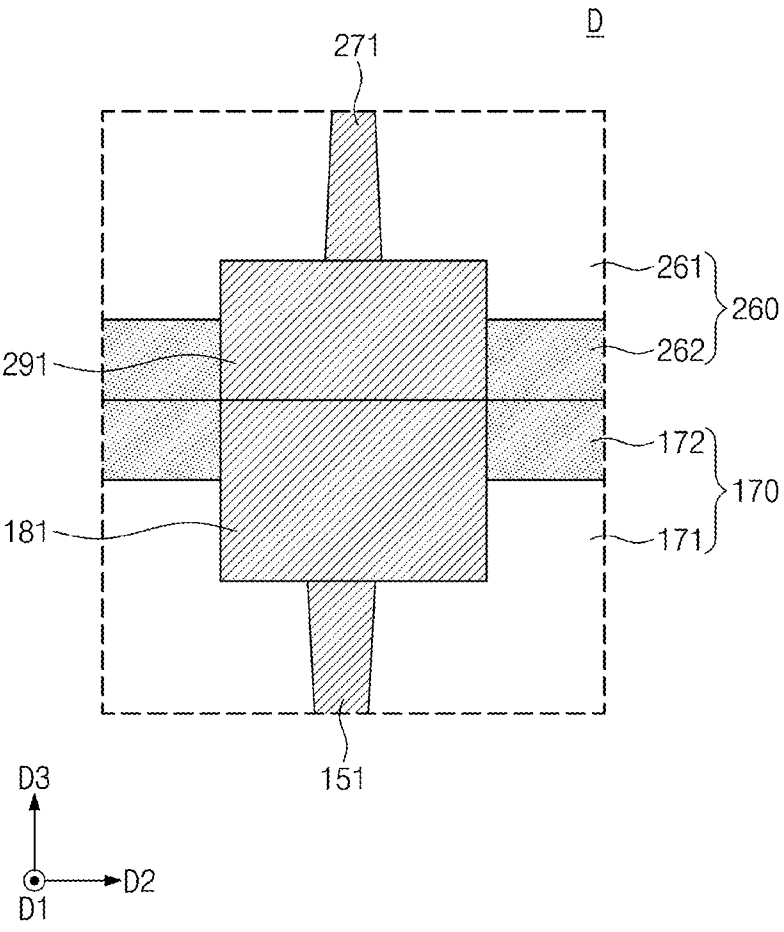
FIG. 1G illustrates an enlarged view showing section D of FIG. 1D.

FIG. 1A illustrates a plan view showing a semiconductor device according to some embodiments. FIG. 1B illustrates an enlarged view showing section A of FIG. 1A. FIG. 1C illustrates an enlarged view showing section B of FIG. 1B. FIG. 1D illustrates a cross-sectional view taken along line I-I' of FIG. 1C. FIG. 1E illustrates a cross-sectional view showing a first peripheral region of FIG. 1A. FIG. 1F illustrates an enlarged view showing section C of FIG. 1D. FIG. 1G illustrates an enlarged view showing section D of FIG. 1D.

Referring to FIGS. 1A and 1B, a semiconductor device 1 may include a plurality of banks BA and a first peripheral region PER1. The first peripheral region PER1 may be disposed between the banks BA. The first peripheral region PER1 may be provided thereon with peripheral circuits for input/output of data, command, or power/ground.

As illustrated in FIG. 1B, each of the banks BA may include cell block regions CR and an extension region EXT between the cell block regions CR. Each of the cell block regions CR may include a sense amplifier region SAR, a second peripheral region PER2, and a sub-word line driver region SWDR. The sense amplifier region SAR may be provided thereon with sense amplifiers. The sub-word line driver region SWDR may be provided thereon with sub-word line drivers.

Referring to FIGS. 1C, 1D, 1E, 1F, and 1G, the semiconductor device 1 may include a lower bonding structure 10, an upper bonding structure 20 on the lower bonding structure 10, and a connection structure 30 on the upper bonding structure 20.

The lower bonding structure 10 may include a lower substrate 110, first device isolation layers 120, first transistors TR1, second transistors TR2, first lower conductive structures 150, second lower conductive structures 160, a lower dielectric structure 170, first lower bonding pads 181, second lower bonding pads 182, and third lower bonding pads 183.

The lower substrate 110 may have a plate shape that extends along a plane defined by a first direction D1 and a second direction D2. The first direction D1 and the second direction D2 may intersect each other. For example, the first direction D1 and the second direction D2 may be horizontal directions that are orthogonal to each other. In some embodiments, the lower substrate 110 may be a semiconductor substrate. For example, the lower substrate 110 may include silicon, germanium, silicon-germanium, gallium-phosphorus, or gallium-arsenic. In some embodiments, the lower substrate 110 may be a silicon-on-insulator (SOI) substrate or a germanium-on-insulator (GOI) substrate.

The first device isolation layers 120 may be provided in the lower substrate 110. The first device isolation layers 120 may include a dielectric material.

The first transistor TR1 and the second transistors TR2 may be provided on the lower substrate 110. The first transistor TR1 and the second transistors TR2 may be disposed between the lower substrate 110 and the lower dielectric structure 170. Each of the first and second transistors TR1 and TR2 may include impurity regions IR, and may also include a channel and a gate structure GST between the impurity regions IR.

The lower substrate 110 may be implanted with impurities to form the impurity regions IR. The gate structure GST may include a gate dielectric layer GI, a gate electrode GE on the gate dielectric layer GI, and a gate capping layer GP on the gate electrode GE. The gate dielectric layer GI and the gate capping layer GP may include a dielectric material. The gate electrode GE may include a conductive material.

The first transistor TR1 may be disposed on the sense amplifier region SAR of the cell block region CR. The first transistor TR1 may be a transistor that constitutes the sense amplifier. The second transistor TR2 may be disposed on the first peripheral region PER1. In some embodiments, the first transistor TR1 may be a transistor that is disposed on the sub-word line driver region SWDR of the cell block region CR and constitutes the sub-word line driver. The first transistor TR1 that constitutes the sub-word line driver may be electrically connected to a cell gate structure 241 of a memory cell structure 240 which will be discussed below.

The lower dielectric structure 170 may cover the first and second transistors TR1 and TR2. The lower dielectric structure 170 may be provided on the lower substrate 110. The lower dielectric structure 170 may include a first lower dielectric layer 171 on the lower substrate 110 and a second lower dielectric layer 172 on the first lower dielectric layer 171. The first lower dielectric layer 171 and the second lower dielectric layer 172 may include different dielectric materials from each other. For example, the first lower dielectric layer 171 may include a $SiO_2$ layer, and the second lower dielectric layer 172 may include a SiCN layer and a SiCON layer.

In some embodiments, the first lower dielectric layer 171 may be a multiple dielectric layer including a plurality of dielectric layers. In some embodiments, the first lower dielectric layer 171 and the second lower dielectric layer 172 may include the same dielectric material. For example, the first and second lower dielectric layers 171 and 172 may include a $SiO_2$ layer.

The first lower conductive structures 150 and the second lower conductive structures 160 may be disposed in the first lower dielectric layer 171 of the lower dielectric structure 170. The first lower conductive structures 150 may be electrically connected to the first transistor TR1. The first lower conductive structures 150 may include first lower contacts 151 and first lower conductive lines 152. A conductive material may be included in the first lower contacts 151 and the first lower conductive lines 152 of the first lower conductive structures 150. The first lower contacts 151 and the first lower conductive lines 152 of the first lower conductive structures 150 may be disposed on the cell block region CR and the extension region EXT. At least a portion of the first lower conductive lines 152 may extend from the extension region EXT toward the sense amplifier region SAR. The first lower contact 151 may have a width that decreases as a level is lowered.

The second lower conductive structures 160 may be electrically connected to the second transistors TR2. The second lower conductive structures 160 may include second lower contacts 161 and second lower conductive lines 162. A conductive material may be included in the second lower contacts 161 and the second lower conductive lines 162 of the second lower conductive structures 160. The second lower contacts 161 and the second lower conductive lines 162 of the second lower conductive structures 160 may be disposed on the first peripheral region PER1. The second lower contact 161 may have a width that decreases as a level is lowered.

The first lower bonding pads 181 may be defined to indicate lower bonding pads disposed on the cell block region CR. The first lower bonding pads 181 may be disposed on the sense amplifier region SAR, the sub-word line driver region SWDR, and the second peripheral region PER2. The second lower bonding pads 182 may be defined to indicate lower bonding pads disposed on the extension region EXT. The third lower bonding pads 183 may be defined to indicate lower bonding pads disposed on the first peripheral region PER1.

The first, second, and third lower bonding pads 181, 182, and 183 may be provided in the lower dielectric structure 170. The first, second, and third lower bonding pads 181, 182, and 183 may be located at a level higher than that of the first and second lower conductive structures 150 and 160, e.g., relative to a bottom of the lower substrate 110. The first, second, and third lower bonding pads 181, 182, and 183 may have their top surfaces coplanar with that of the lower dielectric structure 170, e.g., with a top surface of the second lower dielectric layer 172. The first, second, and third lower bonding pads 181, 182, and 183 may penetrate the second lower dielectric layer 172. The first, second, and third lower bonding pads 181, 182, and 183 may include a conductive material. For example, the first, second, and third lower bonding pads 181, 182, and 183 may include copper. The first, second, and third lower bonding pads 181, 182, and 183 may each have a tetragonal shape when viewed in a plan view (e.g., a top view).

The first lower bonding pad 181 may be electrically connected to the first transistor TR1. The first lower bonding pad 181 may be electrically connected to the first transistor TR1 through the first lower contact 151 and the first lower conductive line 152.

The second lower bonding pad 182 may be electrically connected to the first transistor TR1. The second lower bonding pad 182 may be electrically connected to the first transistor TR1 through the first lower contact 151 and the first lower conductive line 152.

The third lower bonding pad 183 may be electrically connected to the second transistor TR2. The third lower bonding pad 183 may be electrically connected to the second transistor TR2 through the second lower contact 161 and the second lower conductive line 162.

The upper bonding structure 20 may include an upper substrate 210, a second device isolation layer 220, dielectric patterns 230, a memory cell structure 240, a power capacitor structure 250, an upper dielectric structure 260, first upper conductive structures 270, second upper conductive structures 280, first upper bonding pads 291, second upper bonding pads 292, and third upper bonding pads 293.

The upper substrate 210 may have a plate shape that extends along a plane defined by the first direction D1 and the second direction D2. In some embodiments, the upper substrate 210 may be a semiconductor substrate. For example, the upper substrate 210 may include silicon, germanium, silicon-germanium, gallium-phosphorus, or gallium-arsenic. In some embodiments, the upper substrate 210 may be a silicon-on-insulator (SOI) substrate or a germanium-on-insulator (GOI) substrate.

The second device isolation layer 220 may be provided in the upper substrate 210. The second device isolation layer 220 may include a dielectric material.

The upper dielectric structure 260 may be provided between the upper substrate 210 and the lower dielectric structure 170. The upper dielectric structure 260 may cover the memory cell structure 240 and the power capacitor structure 250. The memory cell structure 240 and the power capacitor structure 250 may be disposed between the upper substrate 210 and the upper dielectric structure 260. The upper dielectric structure 260 may be provided on (e.g., directly on) the lower dielectric structure 170. The upper dielectric structure 260 may include a first upper dielectric layer 261 and a second upper dielectric layer 262. The second upper dielectric layer 262 may be provided on (e.g., directly on) the second lower dielectric layer 172, and the first upper dielectric layer 261 may be provided on (e.g., directly on) the second upper dielectric layer 262, e.g., the second upper dielectric layer 262 may be between the second lower dielectric layer 172 and the first upper dielectric layer 261. The first and second upper dielectric layers 261 and 262 may include different dielectric materials from each other. For example, the first upper dielectric layer 261 may include a $SiO_2$ layer, and the second upper dielectric layer 262 may include a SiCN layer and a SiCON layer.

In some embodiments, the first upper dielectric layer 261 may be a multiple dielectric layer including a plurality of dielectric layers. In some embodiments, the first and second upper dielectric layers 261 and 262 may include the same dielectric material. For example, the first and second upper dielectric layers 261 and 262 may include a $SiO_2$ layer.

When the second lower dielectric layer 172 and the second upper dielectric layer 262 include a $SiO_2$ layer, the $SiO_2$ layer of the second lower dielectric layer 172 may be bonded (e.g., directly bonded) to the $SiO_2$ layer of the second upper dielectric layer 262. When the second lower dielectric layer 172 and the second upper dielectric layer 262 include a SiCN layer and a SiCON layer, the SiCON layer of the second lower dielectric layer 172 may be bonded (e.g., directly bonded) to the SiCON layer of the second upper dielectric layer 262.

The dielectric patterns 230 may penetrate the upper substrate 210. The dielectric pattern 230 may have a top surface coplanar with that of the upper substrate 210. The dielectric pattern 230 may have a bottom surface coplanar with that of the upper substrate 210. The bottom surface of the dielectric pattern 230 may be in contact with a top surface of the first upper dielectric layer 261. The dielectric pattern 230 may include a dielectric material.

The memory cell structure 240 may include cell gate structures 241, bit lines BL, and a cell capacitor 243. The memory cell structure 240 may be disposed on the cell block region CR. The memory cell structure 240 may be disposed on the sense amplifier region SAR, the second peripheral region PER2, and the sub-word line driver region SWDR. The memory cell structure 240 may be located at a level higher than that of the sensor amplifier and the sub-word line driver, e.g., relative to a bottom of the lower substrate 110. The memory cell structure 240 may overlap in a third direction D3 with the sensor amplifier and the sub-word line driver. The memory cell structure 240 may overlap in the third direction D3 with the first transistor TR1. The third direction D3 may intersect the first direction D1 and the second direction D2. For example, the third direction D3 may be a vertical direction perpendicular to the first direction D1 and the second direction D2, e.g., the third direction D3 may be perpendicular to a top surface of the lower substrate 110.

The cell gate structures 241 may extend, e.g., lengthwise, in the first direction D1. The cell gate structures 241 may be arranged, e.g., spaced apart from each other, in the second direction D2. The cell gate structures 241 may be buried in the upper substrate 210.

The bit lines BL may extend, e.g., lengthwise, in the second direction D2. The bit lines BL may be arranged, e.g., spaced apart from each other, in the first direction D1. The bit line BL may include a conductive material. The bit line BL may be disposed between the cell gate structure 241 and the cell capacitor 243.

The cell capacitor 243 may store data. The cell capacitor 243 may be electrically connected to the upper substrate 210.

The power capacitor structure 250 may be located at the same level as that of the memory cell structure 240, e.g., the power capacitor structure 250 and the memory cell structure 240 may be positioned at a same distance along the third direction D3 from the bottom of the lower substrate 110. The power capacitor structure 250 may include a power capacitor conductive line 251 and a power capacitor 252. The power capacitor structure 250 may be disposed on the first peripheral region PER1. At least a portion of the second transistors TR2 may overlap in the third direction D3 with the power capacitor structure 250.

The power capacitor conductive line 251 may be located at the same level as that of the bit line BL, e.g., bottom surfaces of the power capacitor conductive line 251 and the bit line BL may be positioned at a same distance along the third direction D3 from the bottom of the lower substrate 110. The power capacitor 252 may be located at the same level as that of the cell capacitor 243, e.g., bottom surfaces of the power capacitor 252 and the cell capacitor 243 may be positioned at a same distance along the third direction D3 from the bottom of the lower substrate 110. The power capacitor 252 may have a similar structure to that of the cell capacitor 243.

The first upper conductive structures 270 and the second upper conductive structures 280 may be disposed in the first upper dielectric layer 261 of the upper dielectric structure 260. The first upper conductive structures 270 may include first upper contacts 271 and first upper conductive lines 272. A conductive material may be included in the first upper contacts 271 and the first upper conductive lines 272 of the first upper conductive structures 270. The first upper contacts 271 and the first upper conductive lines 272 of the first upper conductive structures 270 may be disposed on the cell block region CR and the extension region EXT. At least a portion of the first upper conductive lines 272 may extend from the extension region EXT toward the sense amplifier region SAR. The first upper contact 271 may have a width that increases as a level is lowered.

A portion of the first upper conductive structures 270 may electrically connect the first upper bonding pad 291 to the bit line BL of the memory cell structure 240. Another portion of the first upper conductive structures 270 may electrically connect the second upper bonding pad 292 to a first through via 310 which will be discussed below.

The second upper conductive structures 280 may include second upper contacts 281 and second upper conductive lines 282. A conductive material may be included in the second upper contacts 281 and the second upper conductive lines 282 of the second upper conductive structures 280. The second upper contacts 281 and the second upper conductive lines 282 of the second upper conductive structures 280 may be disposed on the first peripheral region PER1. The second upper contact 281 may have a width that increases as a level is lowered.

A portion of the second upper conductive structure 280 may electrically connect the third upper bonding pad 293 to the power capacitor 252 of the power capacitor structure 250. Another portion of the second upper conductive structures 280 may electrically connect the third upper bonding pad 293 to a second through via 320 which will be discussed below.

The first upper bonding pads 291 may be defined to indicate upper bonding pads disposed on the cell block region CR. The first upper bonding pads 291 may be disposed on the sense amplifier region SAR, the sub-word line driver region SWDR, and the second peripheral region PER2. The second upper bonding pads 292 may be defined to indicate upper bonding pads disposed on the extension region EXT. The third upper bonding pads 293 may be defined to indicate upper bonding pads disposed on the first peripheral region PER1.

The first, second, and third upper bonding pads 291, 292, and 293 may be provided in the upper dielectric structure 260. The first, second, and third upper bonding pads 291, 292, and 293 may be located at a level lower than that of the first and second upper conductive structures 270 and 280, e.g., relative to the bottom of the lower substrate 110. The first, second, and third upper bonding pads 291, 292, and 293 may have their bottom surfaces coplanar with that of the upper dielectric structure 260. The first, second, and third upper bonding pads 291, 292, and 293 may penetrate the second upper dielectric layer 262. The first, second, and third upper bonding pads 291, 292, and 293 may include a conductive material. For example, the first, second, and third upper bonding pads 291, 292, and 293 may include copper. The first, second, and third upper bonding pads 291, 292, and 293 may each have a tetragonal shape when viewed in a plan view.

The bottom surface of the first upper bonding pad 291 may be in contact (e.g., direct contact) with the top surface of the first lower bonding pad 181. The bottom surface of the second upper bonding pad 292 may be in contact (e.g., direct contact) with the top surface of the second lower bonding pad 182. The bottom surface of the third upper bonding pad 293 may be in contact (e.g., direct contact) with the top surface of the third lower bonding pad 183.

The bit line BL of the memory cell structure 240 may be electrically connected to the first transistor TR1 through the first upper conductive structures 270, the first upper bonding pad 291, the first lower bonding pad 181, and the first lower conductive structures 150.

In some embodiments, the first transistor TR1 may be a transistor that is disposed on the sub-word line driver region SWDR of the cell block region CR and constitutes the sub-word line driver, and the cell gate structure 241 may be electrically connected to the first transistor TR1 through the first upper conductive structures 270, the first upper bonding pad 291, the first lower bonding pad 181, and the first lower conductive structures 150.

The power capacitor 252 of the power capacitor structure 250 may be electrically connected to the second transistor TR2 through the second upper conductive structures 280, the third upper bonding pad 293, the third lower bonding pad 183, and the second lower conductive structures 160.

The first upper bonding pads 291 and the first lower bonding pads 181 may overlap in the third direction D3 with the memory cell structure 240. A portion of the third upper bonding pads 293 and a portion of the third lower bonding pads 183 may overlap in the third direction D3 with the power capacitor structure 250.

A first through via 310 and a second through via 320 may be provided. Each of the first and second through vias 310 and 320 may be surrounded by the dielectric pattern 230. Each of the first and second through vias 310 and 320 may have a width that decreases with decreasing distance from the lower substrate 110. The width of each of the first and second through vias 310 and 320 may decrease as a level is lowered. For example, the first and second through vias 310 and 320 may each have a width in the second direction D2 that decreases as a level is lowered, e.g., as a distance from the lower substrate 110 decreases. The first and second through vias 310 and 320 may include a conductive material.

The first and second through vias 310 and 320 may extend, e.g., lengthwise, in the third direction D3. The first through via 310 may be disposed on the extension regions EXT. The first through via 310 may penetrate the upper substrate 210 and the dielectric pattern 230 to be connected to the first upper conductive line 272 disposed at the top of the first upper conductive structures 270.

The second through via 320 may be disposed on the first peripheral region PER1. The second through via 320 may penetrate the upper substrate 210 and the dielectric pattern 230 to be connected to the second upper conductive line 282 disposed at the top of the second upper conductive structures 280.

The first and second through vias 310 and 320 may have their top surfaces located at the same level, e.g., coplanar with each other. The first and second through vias 310 and 320 may have their bottom surfaces located at the same level, e.g., coplanar with each other.

The connection structure 30 may include a connection dielectric structure 410, first connection conductive structures 420, and second connection conductive structures 430. The connection dielectric structure 410 may include a first connection dielectric layer 411 on the upper substrate 210 and a second connection dielectric layer 412 on the first connection dielectric layer 411. The first and second connection dielectric layers 411 and 412 may include different dielectric materials from each other. For example, the first connection dielectric layer 411 may include a $SiO_2$ layer, and the second connection dielectric layer 412 may include a silicon nitride layer.

In some embodiments, the first connection dielectric layer 411 may be a multiple dielectric layer including a plurality of dielectric layers. In some embodiments, the first and second connection dielectric layers 411 and 412 may include the same dielectric material. For example, the first and second connection dielectric layers 411 and 412 may include a $SiO_2$ layer.

The first connection conductive structures 420 and the second connection conductive structures 430 may be disposed in the first connection dielectric layer 411 of the connection dielectric structure 410. The first connection conductive structures 420 may include first connection contacts 421 and first connection conductive lines 422. A conductive material may be included in the first connection contacts 421 and the first connection conductive lines 422 of the first connection conductive structures 420. The first connection contacts 421 may each have a width that decreases as a level is lowered.

The first connection conductive line 422 disposed at the bottom of the first connection conductive structures 420 may be connected to the first through via 310. The first connection conductive structures 420 may be electrically connected to the first transistor TR1 through the first through via 310, the first upper conductive structures 270, the second upper bonding pad 292, the second lower bonding pad 182, and the first lower conductive structures 150.

The second connection conductive structures 430 may include second connection contacts 431, second connection conductive lines 432, and terminals 433. A conductive material may be included in the second connection contacts 431, the second connection conductive lines 432, and the terminals 433 of the second connection conductive structures 430. The first peripheral region PER1 may be provided thereon with the second connection contacts 431, the second connection conductive lines 432, and the terminals 433 of the second connection conductive structures 430. The second connection contacts 431 may each have a width that decreases as a level is lowered.

The second connection conductive line 432 disposed at the bottom of the second connection conductive structures 430 may be connected to the second through via 320. The second connection conductive structures 430 may be electrically connected to the second transistor TR2 through the second through via 320, the second upper conductive structures 280, the third upper bonding pad 293, the third lower bonding pad 183, and the second lower conductive structures 160. The semiconductor device 1 may be electrically connected through the terminal 433 to an external apparatus.

Referring to FIG. 1C, on the sense amplifier region SAR, the number of the first upper bonding pads 291 arranged along the second direction D2 may be related to a pitch in the first direction D1 of the first upper bonding pads 291 and a pitch in the first direction D1 of the bit lines BL. In some embodiments, on the sense amplifier region SAR, the number of the first upper bonding pads 291 arranged in the second direction D2 may be the same as or greater than the number of the bit lines BL arranged in the first direction D1 within the pitch in the first direction D1 of the first upper bonding pads 291. For example, when four bit lines BL are arranged in the first direction D1 within the pitch in the first direction D1 of the first upper bonding pads 291, on the sense amplifier region SAR, the number of the first upper bonding pads 291 arranged in the second direction D2 may be equal to or greater than four.

In some embodiments, the number of the first upper bonding pads 291 disposed on the sense amplifier region SAR may be greater than a value obtained by dividing a length in the first direction D1 of the cell block region CR by a pitch in the first direction D1 of the bit lines BL.

In some embodiments, when the pitch in the first direction D1 of the first upper bonding pads 291 is an integer times (N1 times) a pitch in the first direction D1 of a unit sense amplifier, and when a length in the second direction D2 of the sense amplifier region SAR is an integer times (N2 times) a pitch in the second direction D2 of the unit sense amplifier, the number of the first upper bonding pads 291 arranged in the second direction D2 on the sense amplifier region SAR may be equal to or less than N1×N2. In some embodiments, a value equal or less than about 1 μm may be given to the pitch in the first direction D1 of the first upper bonding pads 291.

In a semiconductor device according to some embodiments, transistors that constitute a sense amplifier and a sub-word line driver may be disposed to overlap a memory cell structure. Therefore, it may be possible to give a relatively large size to the transistors that constitute the sense amplifier and the sub-word line driver, to reduce cost of fabrication for the transistors, and to increase electrical properties of the transistors. In addition, integration of the semiconductor device may be improved to allow the semiconductor device to have a relatively small size.

A semiconductor device according to some embodiments may include bonding pads, and thus a memory cell structure and a transistor that overlap each other may be electrically connected to each other.

Figure 2A:
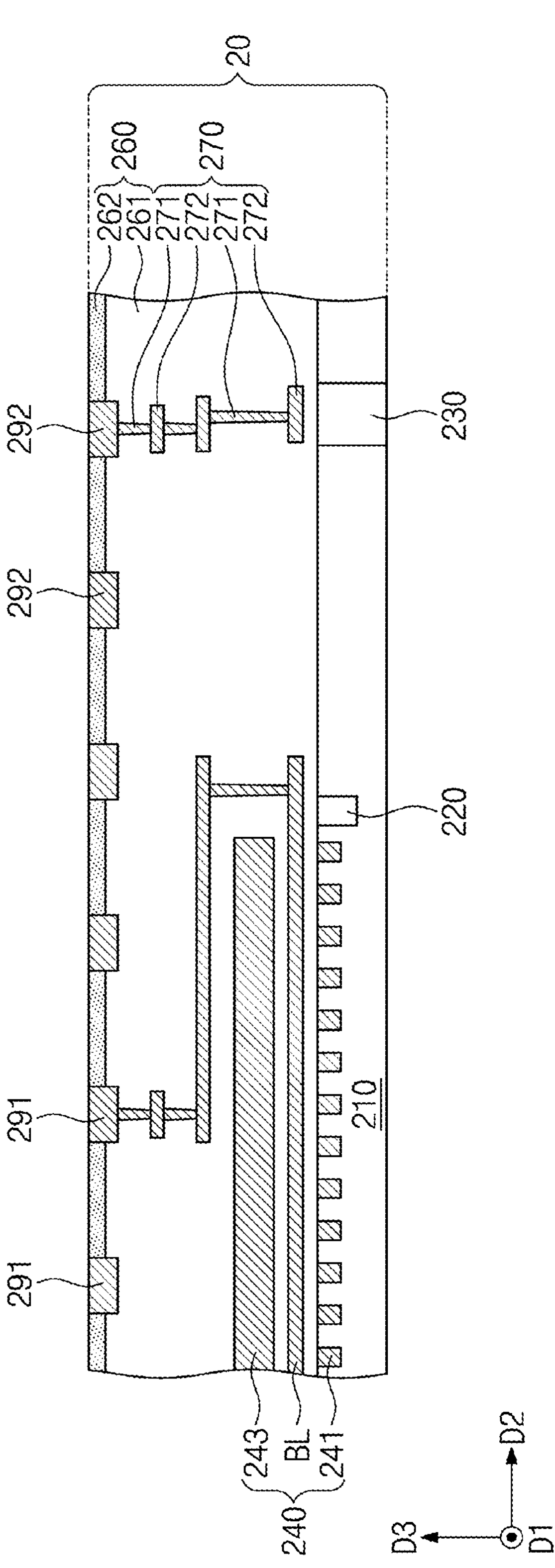
Figure 3A:
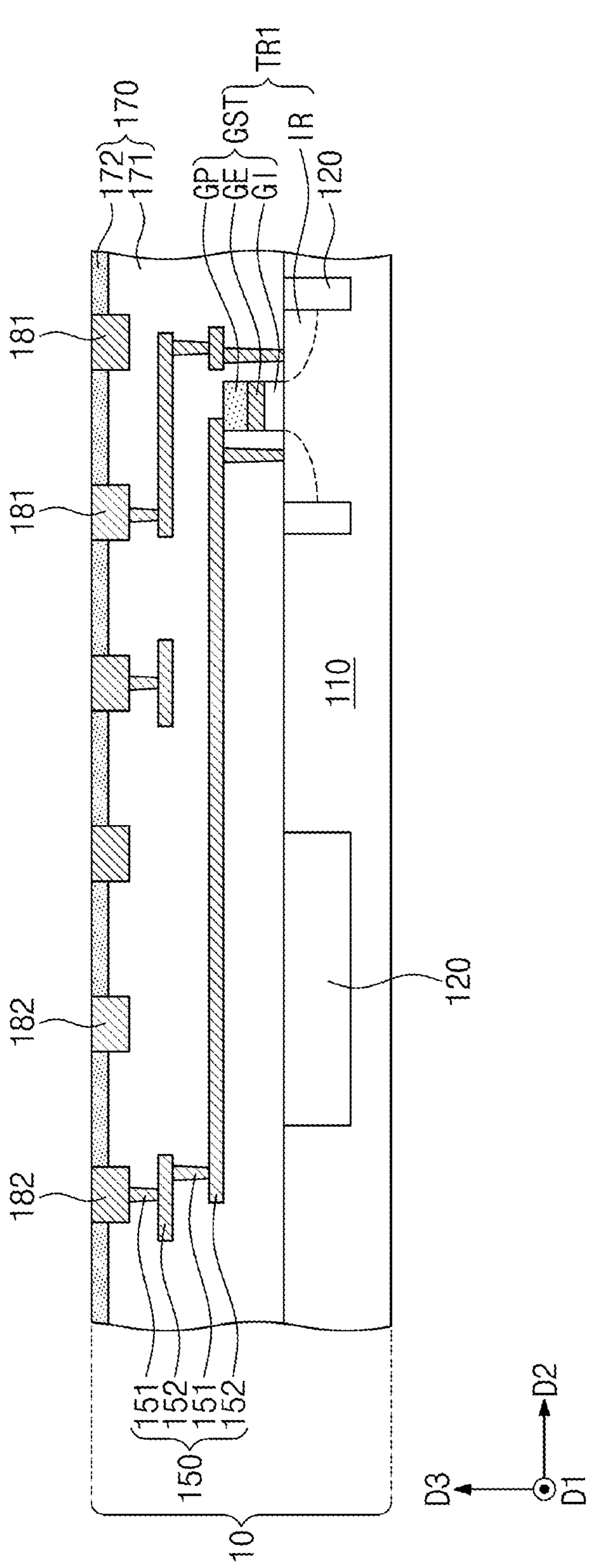
Figure 4A:
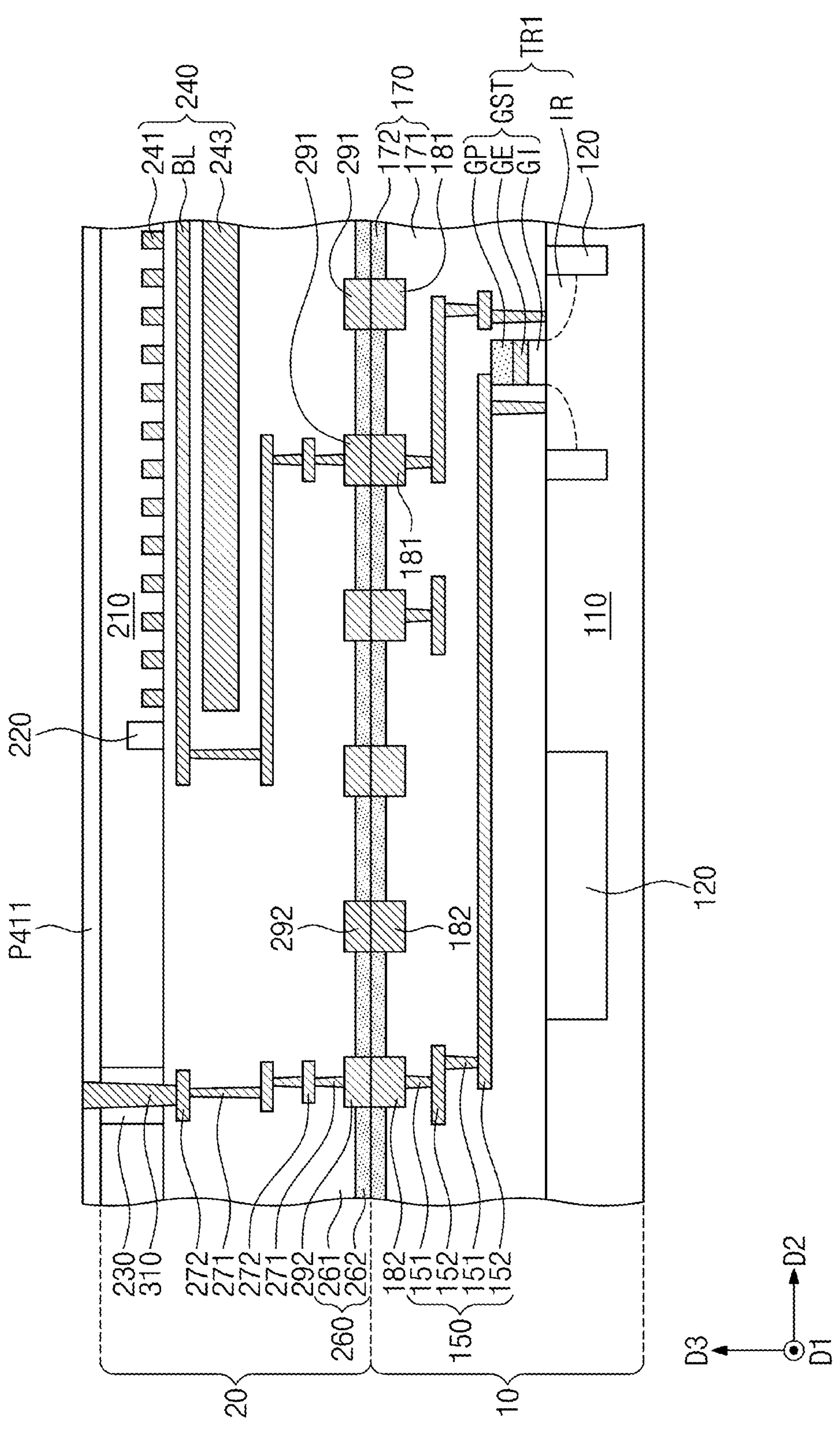

FIGS. 2A, 2B, 3A, 3B, 4A, and 4B illustrate cross-sectional views of stages in a method of fabricating a semiconductor device according to some embodiments. FIGS. 2A, 3A, and 4A correspond to FIG. 1D, and FIGS. 2B, 3B, and 4B correspond to FIG. 1E.

Referring to FIGS. 2A and 2B, the upper bonding structure 20 may be formed. The dielectric patterns 230 may be formed to penetrate the upper substrate 210. The second device isolation layer 220 may be formed in the upper substrate 210.

The memory cell structure 240 may be formed on the upper substrate 210. The power capacitor structure 250 may be formed on the upper substrate 210. The upper dielectric structure 260 may be formed to cover the memory cell structure 240 and the power capacitor structure 250. The first upper conductive structures 270 and the second upper conductive structures 280 may be formed in the upper dielectric structure 260.

The first upper bonding pads 291, the second upper bonding pads 292, and the third upper bonding pads 293 may be formed in the upper dielectric structure 260. The formation of the first, second, and third upper bonding pads 291, 292, and 293 may include forming empty spaces in the upper dielectric structure 260, and filling the empty spaces with the first, second, and third upper bonding pads 291, 292, and 293.

Referring to FIGS. 3A and 3B, the lower bonding structure 10 may be formed. The first device isolation layers 120 may be formed in the lower substrate 110. The first transistor TR1 and the second transistors TR2 may be formed on the lower substrate 110. The first lower conductive structures 150, the second lower conductive structures 160, and the lower dielectric structure 170 may be formed on the lower substrate 110.

The first lower bonding pads 181, the second lower bonding pads 182, and the third lower bonding pads 183 may be formed in the lower dielectric structure 170. The formation of the first, second, and third lower bonding pads 181, 182, and 183 may include forming empty spaces in the lower dielectric structure 170, and filling the empty spaces with the first, second, and third lower bonding pads 181, 182, and 183.

Referring to FIGS. 4A and 4B, the upper bonding structure 20 may be turned upside down, e.g., so the upper dielectric structure 260 faces the lower dielectric structure 170, and bonded to the lower bonding structure 10. A hybrid bonding process may be employed to bond the upper bonding structure 20 to the lower bonding structure 10. The first, second, and third upper bonding pads 291, 292, and 293 may be respectively bonded to the first, second, and third lower bonding pads 181, 182, and 183. The second lower dielectric layer 172 of the lower dielectric structure 170 may be bonded (e.g., directly bonded) to the second upper dielectric layer 262 of the upper dielectric structure 260.

A lower portion P411 of a first connection dielectric layer may be formed on the upper substrate 210. The first through via 310 and the second through via 320 may be formed to penetrate the upper substrate 210. The formation of the first and second through vias 310 and 320 may include forming through holes to penetrate the upper substrate 210 and filling the through holes with a conductive material.

Referring to FIGS. 1D and 1E, the connection dielectric structure 410 may be formed on the upper substrate 210. The first connection conductive structures 420 and the second connection conductive structures 430 may be formed in the connection dielectric structure 410.

Figure 5:
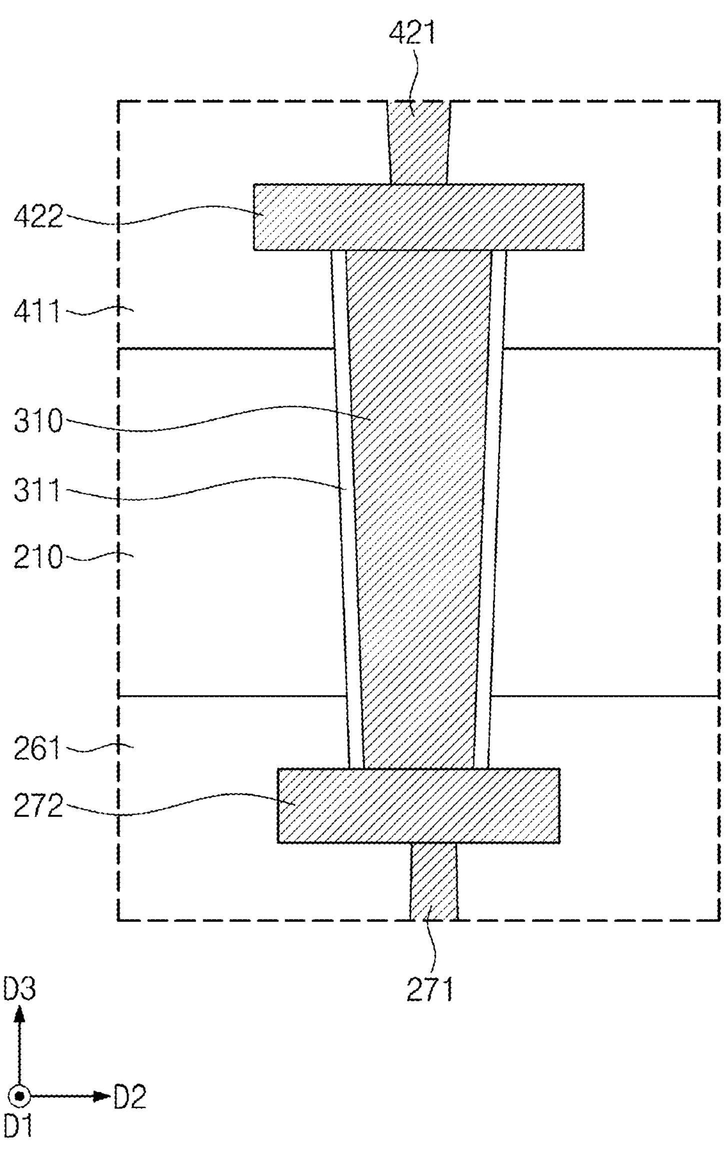
FIG. 5 illustrates an enlarged cross-sectional view showing a semiconductor device according to some embodiments.

FIG. 5 illustrates an enlarged cross-sectional view showing a semiconductor device according to some embodiments.

Referring to FIG. 5, a through dielectric layer 311 may be provided to surround the first through via 310. The through dielectric layer 311 may, e.g., continuously, cover a sidewall of the first through via 310. The through dielectric layer 311 may penetrate in the third direction D3 the upper substrate 210. The through dielectric layer 311 may have a top surface in contact with a bottom surface of the first connection conductive line 422. The top surface of the through dielectric layer 311 may be coplanar with the top surface of the first through via 310. The through dielectric layer 311 may have a bottom surface in contact with a top surface of the first upper conductive line 272. The bottom surface of the through dielectric layer 311 may be coplanar with the bottom surface of the first through via 310. The through dielectric layer 311 may include a dielectric material.

Figure 6:
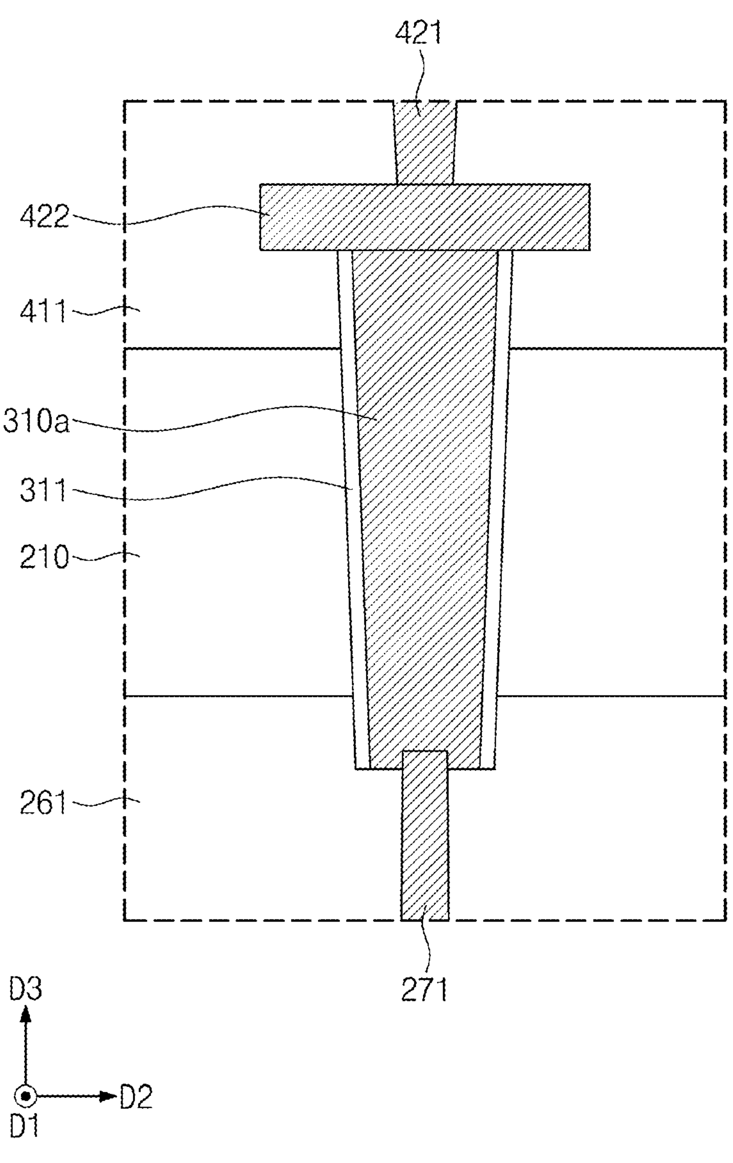
FIG. 6 illustrates an enlarged cross-sectional view showing a semiconductor device according to some embodiments.

FIG. 6 illustrates an enlarged cross-sectional view showing a semiconductor device according to some embodiments.

Referring to FIG. 6, a first through via 310*a* may be in contact with a first upper contact 271*a*. The first upper contact 271*a* may penetrate a bottom surface of the first through via 310*a*. A lower portion of the first through via 310*a* may surround an upper portion of the first upper contact 271*a*. The upper portion of the first upper contact 271*a* may be provided in the lower portion of the first through via 310*a*. The lower portion of the through dielectric layer 311 may surround the upper portion of the first upper contact 271*a*. The first through via 310*a* may have a width that decreases as a level is lowered. The first upper contact 271*a* may have a width that decreases as a level is raised.

Figure 7:
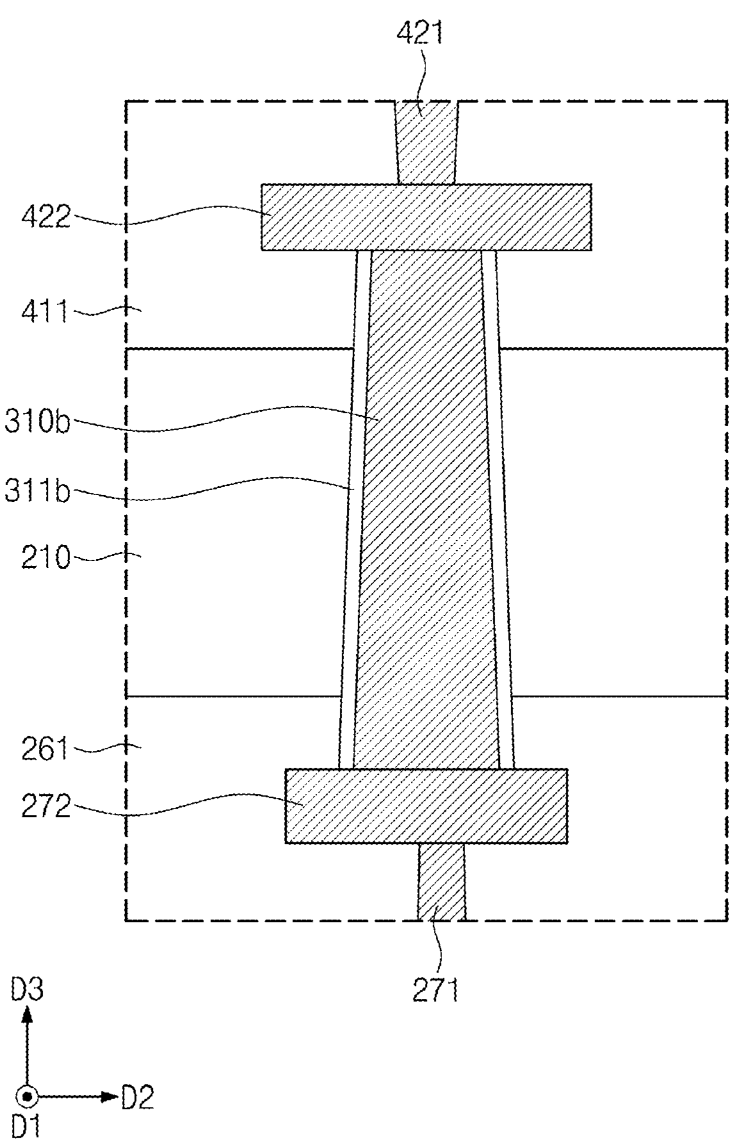
FIG. 7 illustrates an enlarged cross-sectional view showing a semiconductor device according to some embodiments.

FIG. 7 illustrates an enlarged cross-sectional view showing a semiconductor device according to some embodiments.

Referring to FIG. 7, a first through via 310*b* may have a width that decreases as a level is raised. The first through via 310*b* may have a top surface having a width that is less than that of a bottom surface of the first through via 310*b*. The first through via 310*b* may be surrounded by a through dielectric layer 311*b* having a width that decreases as a level is raised.

Figure 8:
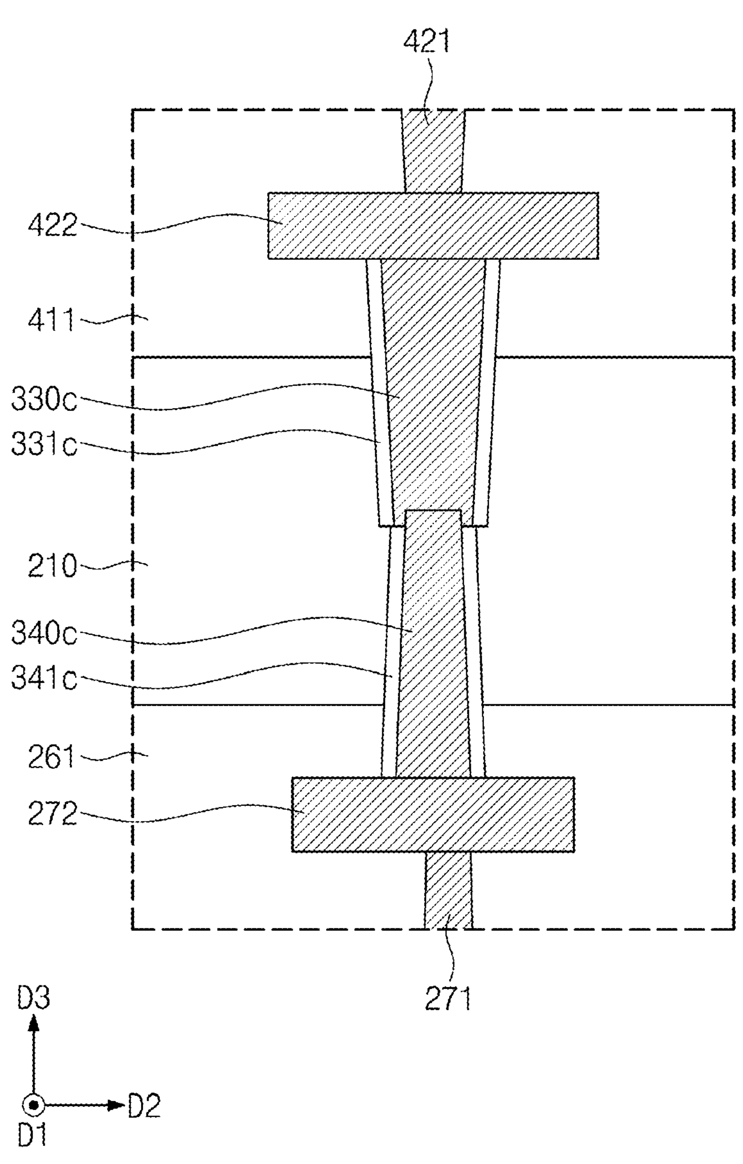
FIG. 8 illustrates an enlarged cross-sectional view showing a semiconductor device according to some embodiments.

FIG. 8 illustrates an enlarged cross-sectional view showing a semiconductor device according to some embodiments.

Referring to FIG. 8, a semiconductor device may include a first connection via 330*c* in contact with the bottom surface of the first connection conductive line 422 and a second connection via 340*c* in contact with the top surface of the first upper conductive line 272. A first through dielectric layer 331*c* may be provided to surround the first connection via 330*c*, and a second through dielectric layer 341*c* may be provided to surround the second connection via 340*c*.

The first through via 330*c* may have a width that decreases as a level is lowered. A lowermost portion of the first connection via 330*c* may be provided in the upper substrate 210. The lowermost portion of the first connection via 330*c* may be disposed between the top and bottom surfaces of the upper substrate 210. The second through via 340*c* may have a width that increases as a level is lowered. An uppermost portion of the second connection via 340*c* may be provided in the upper substrate 210. The uppermost portion of the second connection via 340*c* may be disposed between the top and bottom surfaces of the upper substrate 210.

The first connection via 330*c* and the second connection via 340*c* may be in contact with each other. The second connection via 340*c* may penetrate a bottom surface of the first connection via 330*c*. A lower portion of the first connection via 330*c* may surround an upper portion of the second connection via 340*c*. The upper portion of the second connection via 340*c* may be provided in the lower portion of the first connection via 330*c*. A top surface of the second through dielectric layer 341*c* may be in contact with the bottom surface of the first connection via 330*c* and a bottom surface of the first through dielectric layer 331*c*.

FIG. 9 illustrates a plan view showing bit lines and bonding pads of a semiconductor device according to some embodiments.

Referring to FIG. 9, in a semiconductor device, a first upper bonding pad 291*d* and a first lower bonding pad 181*d* may overlap in the third direction D3 with the bit lines BL. For example, the first upper bonding pad 291*d* may overlap in the third direction D3 with three bit lines BL. The first upper bonding pad 291*d* and the first lower bonding pad 181*d* may each have a tetragonal shape when viewed in a plan view.

The first upper bonding pads 291*d* that are adjacent in the second direction D2 may partially (e.g., only partially) overlap each other in the second direction D2. The first upper bonding pads 291*d* that are adjacent in the second direction D2 may have their sidewalls parallel to the second direction D2, and the sidewalls of the first upper bonding pads 291*d* may not be disposed on a straight line that extends in the second direction D2. The first upper bonding pads 291*d* that are adjacent in the second direction D2 may be offset from each other in the first direction D1. For example, the first upper bonding pads 291*d* that are adjacent in the second direction D2 may be offset in the first direction D1 as much as a pitch in the first direction D1 of the bit lines BL. An arrangement of the first lower bonding pads 181*d* may be similar to that of the first upper bonding pads 291*d*.

FIG. 10 illustrates a plan view showing bit lines and bonding pads of a semiconductor device according to some embodiments.

Referring to FIG. 10, in a semiconductor device, a first upper bonding pad 291*e* and a first lower bonding pad 181*e* may overlap in the third direction D3 with the bit lines BL. For example, the first upper bonding pad 291*e* may overlap in the third direction D3 with three bit lines BL. The first upper bonding pad 291*e* and the first lower bonding pad 181*e* may each have a rhombic shape when viewed in a plan view. The first upper bonding pad 291*e* and the first lower bonding pad 181*e* may have their sidewalls intersect the first direction D1 and the second direction D2, e.g., at an oblique angle.

The first upper bonding pads 291*e* that are adjacent in the second direction D2 may be offset from each other in the first direction D1. For example, the first upper bonding pads 291*e* that are adjacent in the second direction D2 may be offset in the first direction D1 as much as a pitch in the first direction D1 of the bit lines BL. An arrangement of the first lower bonding pads 181*e* may be similar to that of the first upper bonding pads 291*e*.

FIG. 11 illustrates a plan view showing bit lines and bonding pads of a semiconductor device according to some embodiments.

Referring to FIG. 11, a first upper bonding pad 291*f* and a first lower bonding pad 181*f* of a semiconductor device may overlap in the third direction D3 with the bit lines BL. For example, the first upper bonding pad 291*f* may overlap in the third direction D3 with three bit lines BL. The first upper bonding pad 291*f* and the first lower bonding pad 181*f* may each have a circular shape when viewed in a plan view.

The first upper bonding pads 291*f* that are adjacent in the second direction D2 may be offset from each other in the first direction D1. For example, the first upper bonding pads 291*f* that are adjacent in the second direction D2 may be offset in the first direction D1 as much as a pitch in the first direction D1 of the bit lines BL. An arrangement of the first lower bonding pads 181*f* may be similar to that of the first upper bonding pads 291*f*.

Figure 12:
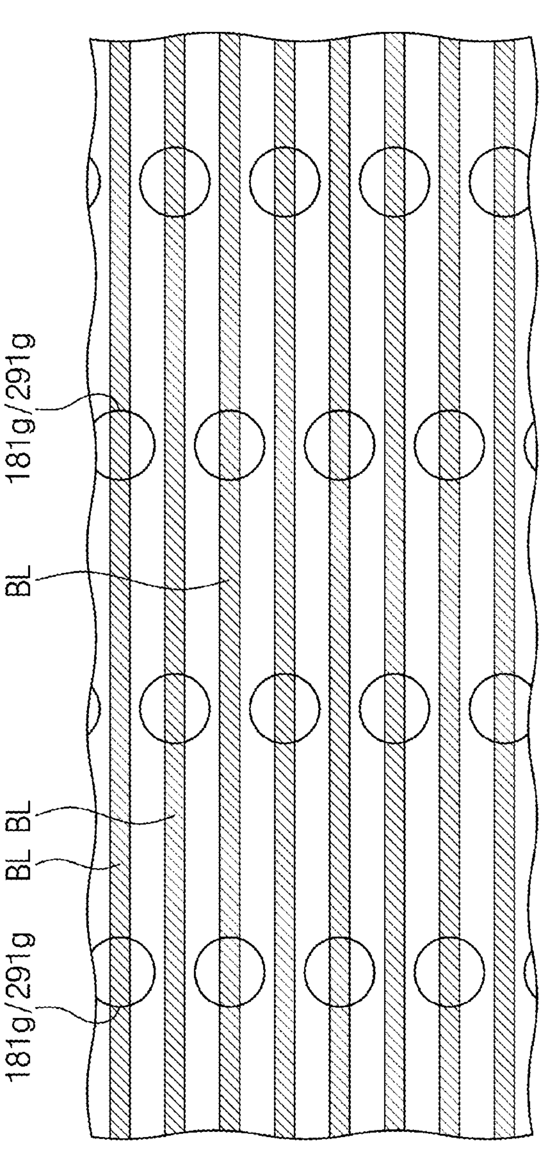
FIG. 12 illustrates a plan view showing an arrangement of bonding pads in a semiconductor device according to some embodiments.

FIG. 12 illustrates a plan view showing bit lines and bonding pads of a semiconductor device according to some embodiments.

Referring to FIG. 12, a first upper bonding pad 291*g* and a first lower bonding pad 181*g* of a semiconductor device may overlap in the third direction D3 with the bit lines BL. For example, one first upper bonding pad 291*g* may overlap in the third direction D3 with one bit line BL (e.g., only one bit line BL). The first upper bonding pad 291*g* and the first lower bonding pad 181*g* may each have a circular shape when viewed in a plan view.

The first upper bonding pads 291*g* that are adjacent in the second direction D2 may be offset from each other in the first direction D1. For example, the first upper bonding pads 291*g* that are adjacent in the second direction D2 may be offset in the first direction D1 as much as a pitch in the first direction D1 of the bit lines BL. An arrangement of the first lower bonding pads 181*g* may be similar to that of the first upper bonding pads 291*g*.

FIG. 13 illustrates a plan view showing bit lines and bonding pads of a semiconductor device according to some embodiments.

Referring to FIG. 13, a first upper bonding pad 291*h* and a first lower bonding pad 181*h* of a semiconductor device may overlap in the third direction D3 with the bit lines BL. For example, the first upper bonding pad 291*h* may overlap in the third direction D3 with three bit lines BL. The first upper bonding pad 291*h* and the first lower bonding pad 181*h* may each have a hexagonal shape when viewed in a plan view.

The first upper bonding pads 291*h* that are adjacent in the second direction D2 may be offset from each other in the first direction D1. For example, the first upper bonding pads 291*h* that are adjacent in the second direction D2 may be offset in the first direction D1 as much as a pitch in the first direction D1 of the bit lines BL. An arrangement of the first lower bonding pads 181*h* may be similar to that of the first upper bonding pads 291*h*.

Figure 14:
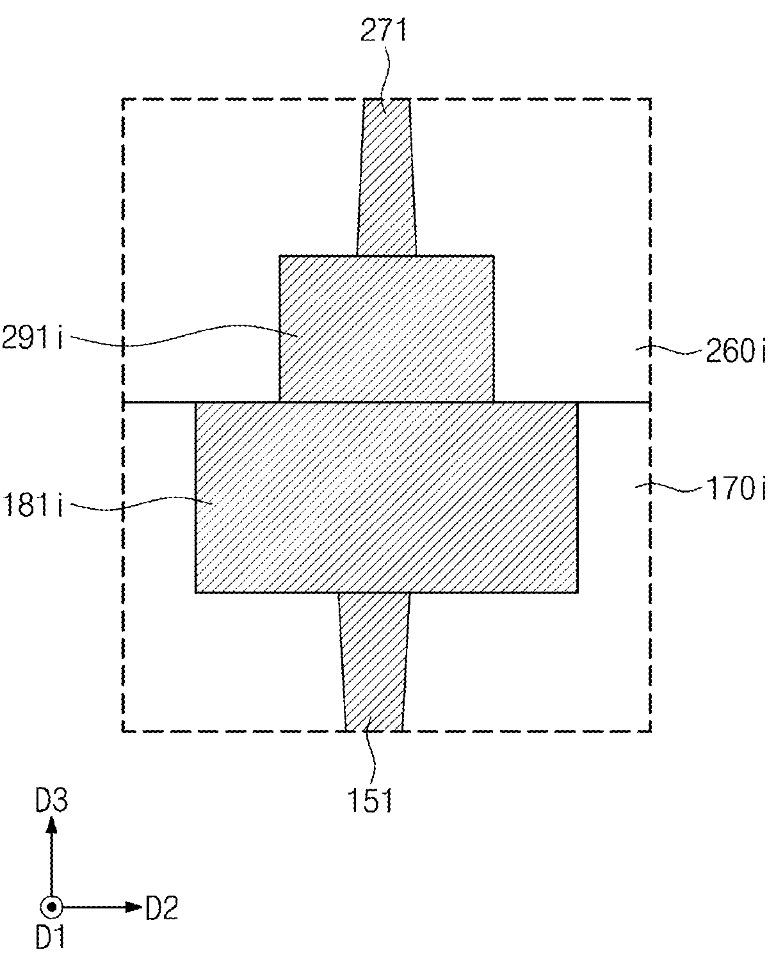
FIG. 14 illustrates an enlarged cross-sectional view showing a semiconductor device according to some embodiments.

FIG. 14 illustrates an enlarged cross-sectional view showing a semiconductor device according to some embodiments.

Referring to FIG. 14, a lower dielectric structure 170*i* and an upper dielectric structure 260*i* of a semiconductor device may include the same dielectric material. For example, the lower dielectric structure 170*i* and the upper dielectric structure 260*i* may include a $SiO_2$ layer.

A first lower bonding pad 181*i* may have a width greater than that of a first upper bonding pad 291*i*. The first lower bonding pad 181*i* may have a top surface in contact with a bottom surface of the upper dielectric structure 260*i*.

Figure 15:
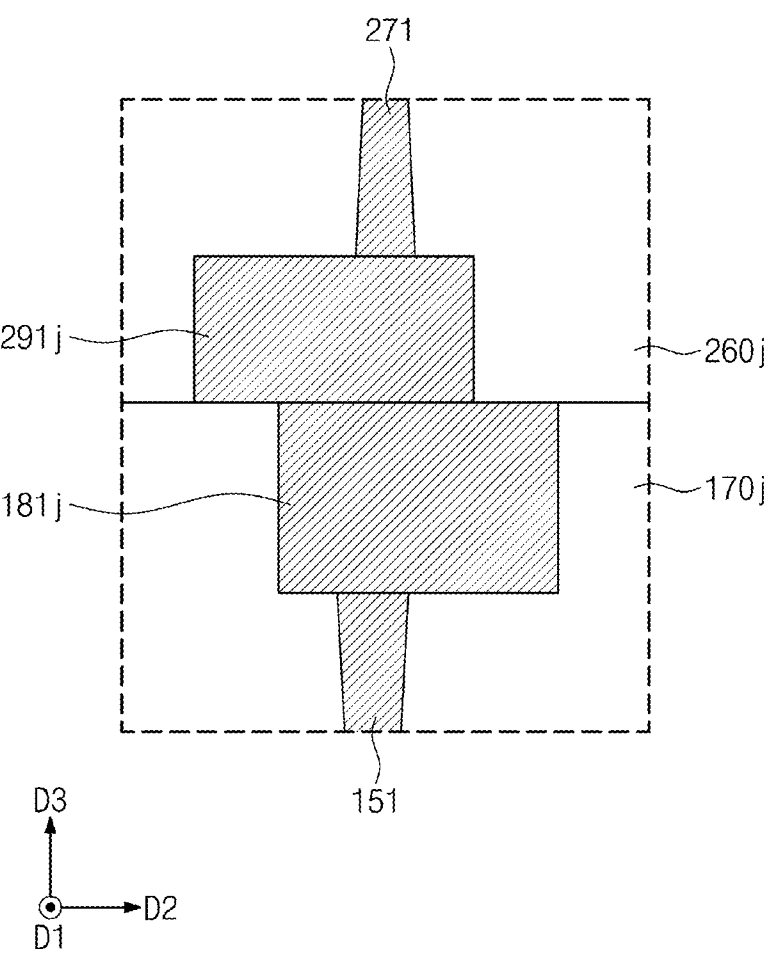
FIG. 15 illustrates an enlarged cross-sectional view showing a semiconductor device according to some embodiments.

FIG. 15 illustrates an enlarged cross-sectional view showing a semiconductor device according to some embodiments.

Referring to FIG. 15, a lower dielectric structure 170*j* and an upper dielectric structure 260*j* of a semiconductor device may include the same dielectric material. For example, the lower dielectric structure 170*j* and the upper dielectric structure 260*j* may include a $SiO_2$ layer.

A first lower bonding pad 181*j* may have a top surface in contact with a bottom surface of a first upper bonding pad 291*j* and a bottom surface of the upper dielectric structure 260*j*. The bottom surface of the first upper bonding pad 291*j* may be in contact with the lower dielectric structure 170*j*.

FIG. 16 illustrates a cross-sectional view showing a semiconductor device according to some embodiments.

Referring to FIG. 16, a semiconductor device may include a first cell region CR1, a second cell region CR2, and an extension region EXT between the first and second cell regions CR1 and CR2. A sub-word line driver region SWDR of the second cell region CR2, the extension region EXT, and a sense amplifier region SAR of the first cell region CR1 may be arranged in the second direction D2.

The first transistors TR1 may be disposed on the first and second cell regions CR1 and CR2. The memory cell structures 240 may be disposed on the first and second cell regions CR1 and CR2.

The semiconductor device may further include region connection conductive structures 440 that electrically connect the bit line BL of the second cell region CR2 to the first transistor TR1 of the first cell region CR1. The region connection conductive structures 440 may include region connection contacts 441 and region connection conductive lines 442. The bit line BL of the second cell region CR2 may be electrically connected to the first transistor TR1 of the first cell region CR1 through the region connection contact 441, the region connection conductive line 442, the first upper bonding pad 291, the first lower bonding pad 181, the first lower contact 151, and the first lower conductive line 152. At least one of the region connection conductive lines 442 may extend from the extension region EXT toward the first cell region CR1.

In some embodiments, the bit line BL of the second cell region CR2 may be a complementary bit line. In some embodiments, the first upper bonding pad 291 and the first lower bonding pad 181 that are electrically connected to the bit line BL of the first cell region CR1 may be disposed closer to the extension region EXT than the first upper bonding pad 291 and the first lower bonding pad 181 that are electrically connected to the bit line BL of the second cell region CR2. In some embodiments, the first upper bonding pad 291 and the first lower bonding pad 181 that are electrically connected to the bit line BL of the first cell region CR1 may be alternately disposed (e.g., in the second direction D2) with the first upper bonding pad 291 and the first lower bonding pad 181 that are electrically connected to the bit line BL of the second cell region CR2.

In some embodiments, a pitch in the first direction D1 of the first lower conductive lines 152 may be less than a pitch in the first direction D1 of the first lower bonding pads 181.

Figure 17A:
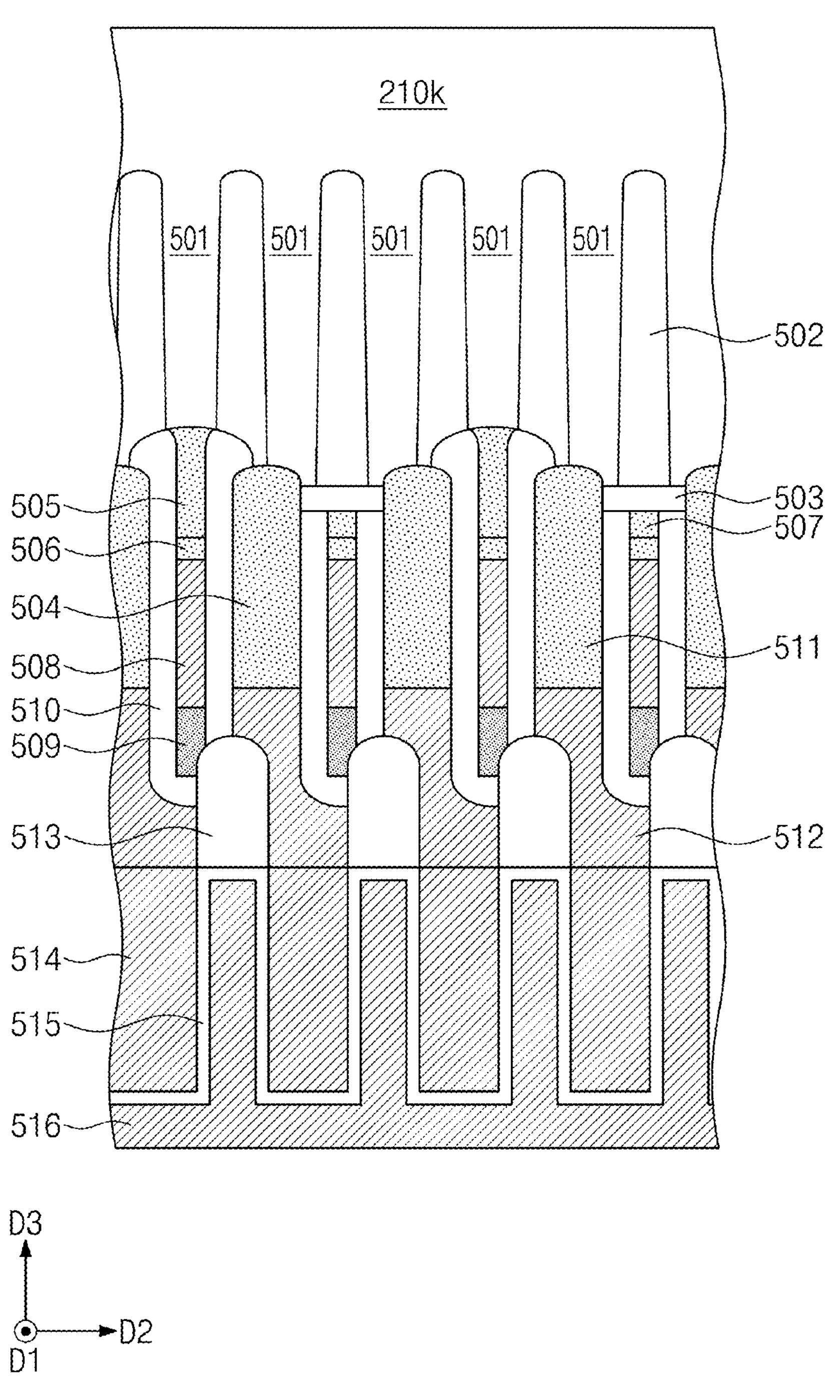
FIGS. 17A and 17B illustrate cross-sectional views showing a memory cell structure according to some embodiments.
Figure 17B:
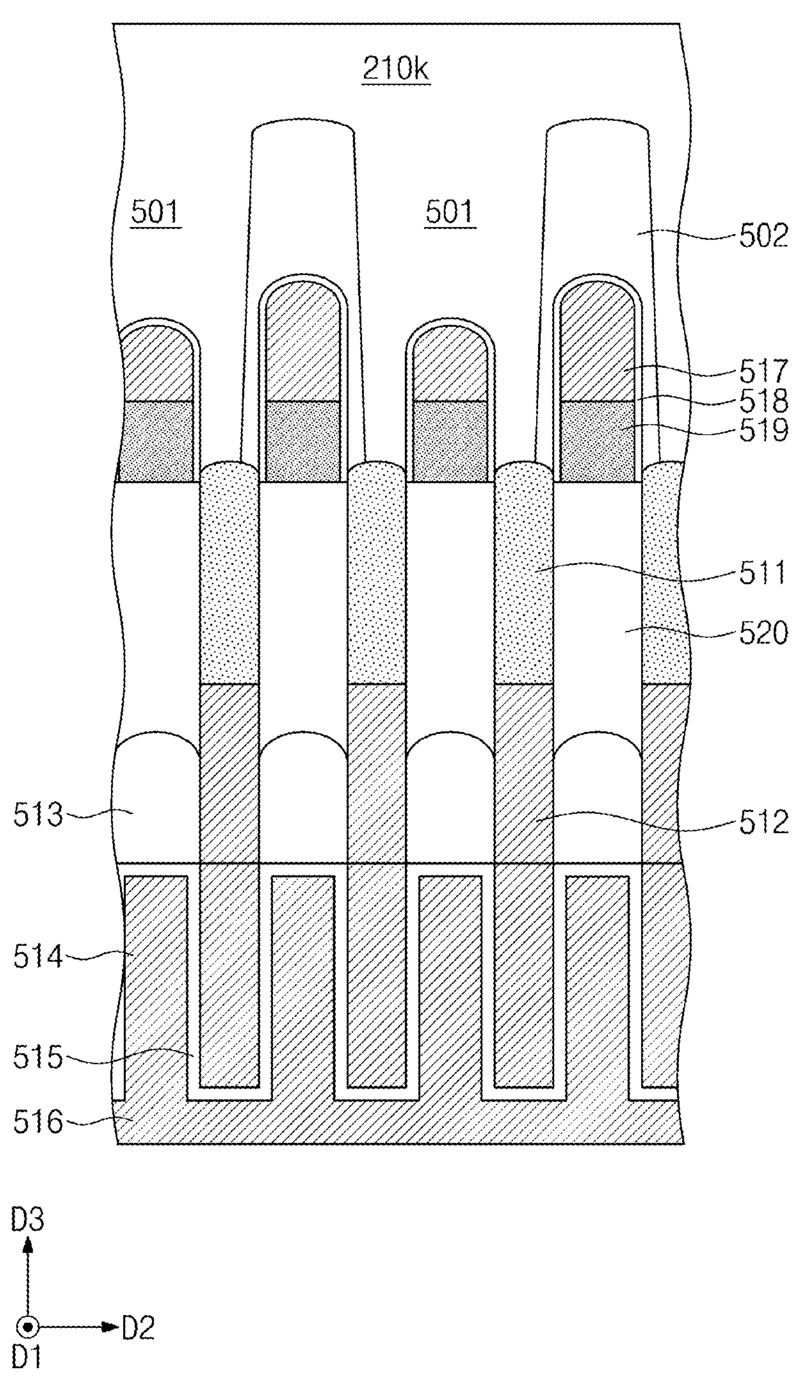

FIGS. 17A and 17B illustrate cross-sectional views showing a memory cell structure according to some embodiments.

Referring to FIGS. 17A and 17B, a memory cell structure may be provided which is connected to an upper substrate 210*k*. The memory cell structure may include active patterns 501, cell device isolation layers 502, cell dielectric layers 503, bit-line contacts 505, first conductive layers 507, second conductive layers 506, third conductive layers 508, bit-line capping layers 509, bit-line spacers 510, node contacts 511, landing pads 512, a landing pad isolation layer 513, first cell capacitor electrodes 514, a cell capacitor dielectric layer 515, a second cell capacitor electrode 516, cell gate electrodes 517, cell gate dielectric layers 518, cell gate capping layers 519, and dielectric fences 520.

The active pattern 501 may be defined to indicate lower portions of the upper substrate 210*k* that protrude in a direction reverse to the third direction D3. The active patterns 501 may be spaced apart from each other.

The cell device isolation layers 502 may be provided in a space between the active patterns 501. The cell device isolation layers 502 may be provided in the upper substrate 210*k*. The active patterns 501 may be defined by the cell device isolation layers 502. The cell device isolation layer 502 may include a dielectric material.

A gate structure may be provided which includes the cell gate electrode 517, the cell gate dielectric layer 518, and the cell gate capping layer 519. The gate structures may extend in the first direction D1. The gate structures may be arranged in the second direction D2. The gate structure may be a buried gate structure that is buried in the active patterns 501 and the cell device isolation layer 502. The cell gate dielectric layer 518 and the cell gate capping layer 519 may include a dielectric material. The cell gate electrode 517 may include a conductive material.

The cell dielectric layers 503 may be provided on bottom surfaces of the cell device isolation layers 502 and the gate structures. The cell dielectric layer 503 may include a dielectric material. In some embodiments, the cell dielectric layer 503 may include a plurality of dielectric layers.

Bit-line structures may be provided which extend in the second direction D2. The bit-line structures may be arranged in the first direction D1. The bit-line structure may include bit-line contacts 505, first conductive layers 507, a second conductive layer 506, a third conductive layer 508, a bit-line capping layer 509, and a bit-line spacer 510.

The bit-line contacts 505 and the first conductive layers 507 of the bit-line structure may be alternately disposed along the second direction D2. The bit-line contact 505 may be connected to the active pattern 501. The first conductive layer 507 may be provided on a bottom surface of the cell dielectric layer 503. In some embodiments, the bit-line contacts 505 and the first conductive layers 507 included in one bit-line structure may be connected into a single unitary structure with no boundary therebetween.

The second conductive layer 506 may be provided on bottom surfaces of the first conductive layers 507 and the bit-line contacts 505. The third conductive layer 508 may be provided on a bottom surface of the second conductive layer

506. The bit-line capping layer 509 may be provided on a bottom surface of the third conductive layer 508. A conductive material may be included in the bit-line contact 505, the first conductive layer 507, the second conductive layer 506, and the third conductive layer 508. The bit-line capping layer 509 may include a dielectric material.

The bit-line spacer 510 may cover a bottom surface and a sidewall of the bit-line capping layer 509, sidewalls of the first, second, and third conductive layers 507, 506, and 508, and sidewalls of the bit-line contacts 505. The bit-line spacer 510 may include a dielectric material. In some embodiments, the bit-line spacer 510 may include a plurality of dielectric layers.

The node contact 511 may be connected to the active pattern 501. The node contact 511 may be provided between neighboring bit-line structures. The node contact 511 may include a conductive material. For example, the node contact 511 may include polysilicon.

The landing pad 512 may be provided on a bottom surface of the node contact 511. The landing pad 512 may include a conductive material. In some embodiments, a metal silicide layer and a barrier layer may be provided between the node contact 511 and the landing pad 512.

The dielectric fence 520 may be provided on a bottom surface of the cell gate capping layer 519. The dielectric fence 520 may be provided between the node contacts 511 that are adjacent to each other in the second direction D2. The dielectric fence 520 may include a dielectric material.

The landing pad isolation layer 513 may be provided on a bottom surface of the dielectric fence 520. The landing pad isolation layer 513 may separate the landing pads 512 from each other. The landing pad isolation layer 513 may surround the landing pad 512. The landing pad isolation layer 513 may include a dielectric material.

A cell capacitor may be constituted by the first cell capacitor electrode 514, the cell capacitor dielectric layer 515, and the second cell capacitor electrode 516. The cell capacitor dielectric layer 515 may be provided between the first cell capacitor electrode 514 and the second cell capacitor electrode 516. The first and second cell capacitor electrodes 514 and 516 may include a conductive material. The cell capacitor dielectric layer 515 may include a dielectric material. A semiconductor device may be a dynamic random access memory (DRAM) including the cell capacitor.

In some embodiments, the memory cell structure may include a magnetic tunnel junction pattern instead of the cell capacitor. In this case, the semiconductor device may be a magnetic tunnel junction pattern (MRAM). In some embodiments, the memory cell structure may include a phase change material or a variable resistance material instead of the cell capacitor. In this case, the semiconductor device may be a phase change random access memory (PRAM) or a resistive random access memory (ReRAM). In some embodiments, various structures and/or materials capable of storing data may be provided instead of the cell capacitor. In some embodiments, the memory cell structure may include a vertical channel transistor (VCT) in which a channel extends in the third direction D3.

Embodiments provide a semiconductor device whose electrical properties are improved. That is, in a semiconductor device according to some embodiments, as sense amplifiers overlap a memory cell structure, it may be possible to reduce a size of a unit sense amplifier, to decrease cost of fabrication for the sense amplifier, and to improve electrical properties of the sense amplifier.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:

a lower substrate;

a lower dielectric structure on the lower substrate;

a transistor between the lower substrate and the lower dielectric structure;

a lower bonding pad in the lower dielectric structure;

an upper dielectric structure on the lower dielectric structure;

an upper substrate on the upper dielectric structure;

a memory cell structure between the upper substrate and the upper dielectric structure; and an upper bonding pad in the upper dielectric structure, a top surface of the lower bonding pad being in contact with a bottom surface of the upper bonding pad, and the lower bonding pad and the upper bonding pad overlapping the memory cell structure, wherein the memory cell structure includes:

a cell gate structure;

a cell capacitor; and a bit line between the cell gate structure and the cell capacitor, the first upper bonding pad and the first lower bonding pad overlapping the bit line.

2. The semiconductor device as claimed in claim 1, wherein the transistor constitutes a sense amplifier.

3. The semiconductor device as claimed in claim 1, wherein the transistor overlaps the memory cell structure.

4. The semiconductor device as claimed in claim 1, wherein the transistor and the memory cell structure are electrically connected through the lower bonding pad and the upper bonding pad.

5. The semiconductor device as claimed in claim 1, further comprising:

an upper conductive structure that connects a bit line of the memory cell structure to the upper bonding pad; and a lower conductive structure that connects the transistor to the lower bonding pad.

6. The semiconductor device as claimed in claim 1, wherein a bottom surface of the upper dielectric structure is bonded to a top surface of the lower dielectric structure.

7. The semiconductor device as claimed in claim 1, wherein a level of the memory cell structure is higher than a level of the upper bonding pad and a level of the lower bonding pad.

8. The semiconductor device as claimed in claim 1, further comprising a through via that penetrates the upper substrate, the through via being electrically connected to the transistor.

9. A semiconductor device, comprising:

a lower bonding structure that includes a lower substrate, a lower dielectric structure on the lower substrate, a first transistor between the lower substrate and the lower dielectric structure, and a first lower bonding pad in the lower dielectric structure; and an upper bonding structure that includes an upper dielectric structure on the lower dielectric structure, an upper substrate on the upper dielectric structure, a memory cell structure between the upper substrate and the upper dielectric structure, and a first upper bonding pad in the upper dielectric structure, wherein the first lower bonding pad is in contact with the first upper bonding pad, wherein the first transistor overlaps the memory cell structure, and wherein the first transistor is electrically connected to the memory cell structure through the first upper bonding pad and the first lower bonding pad, wherein the semiconductor device further comprises:

a connection structure that includes a connection dielectric structure on the upper substrate and a connection conductive structure in the connection dielectric structure; and a through via that electrically connects the connection conductive structure to the first transistor, the through via penetrating the upper substrate.

10. The semiconductor device as claimed in claim 9, wherein the first upper bonding pad and the first lower bonding pad overlap the memory cell structure.

11. The semiconductor device as claimed in claim 9, wherein the memory cell structure includes:

a cell gate structure;

a cell capacitor; and a bit line between the cell gate structure and the cell capacitor, the first upper bonding pad and the first lower bonding pad overlapping the bit line.

12. The semiconductor device as claimed in claim 11, wherein the first upper bonding pad and the first lower bonding pad overlap the cell gate structure and the cell capacitor.

13. The semiconductor device as claimed in claim 9, wherein:

the lower bonding structure further includes a second lower bonding pad electrically connected to the first transistor, the upper bonding structure further includes a second upper bonding pad electrically connected to the through via, and the second upper bonding pad is in contact with the second lower bonding pad.

14. The semiconductor device as claimed in claim 9, wherein:

the lower bonding structure includes:

a second transistor between the lower substrate and the lower dielectric structure; and a second lower bonding pad electrically connected to the second transistor, and the upper bonding structure includes:

a power capacitor between the upper substrate and the upper dielectric structure; and a second upper bonding pad electrically connected to the power capacitor, the second lower bonding pad being in contact with the second upper bonding pad.

15. The semiconductor device as claimed in claim 14, wherein the second upper bonding pad and the second lower bonding pad overlap the power capacitor.

16. The semiconductor device as claimed in claim 14, wherein the memory cell structure includes a cell capacitor, the cell capacitor being at the same level as a level of the power capacitor.

17. The semiconductor device as claimed in claim 9, wherein:

the memory cell structure includes bit lines that extend in a first direction and are arranged in a second direction that intersects the first direction, the first upper bonding pad includes two first upper bonding pads that are adjacent to each other in the first direction, and the two first upper bonding pads are offset in the second direction.

18. The semiconductor device as claimed in claim 17, wherein a pitch in the second direction of the bit lines is the same as an offset distance in the second direction between the two first upper bonding pads.

19. A semiconductor device, comprising:

a lower substrate;

a lower dielectric structure on the lower substrate;

a transistor between the lower substrate and the lower dielectric structure;

an upper dielectric structure on the lower dielectric structure;

an upper substrate on the upper dielectric structure;

a memory cell structure between the upper substrate and the upper dielectric structure, the memory cell structure including a bit line;

a connection dielectric structure on the upper substrate;

a connection conductive structure in the connection dielectric structure;

a first lower bonding pad and a first upper bonding pad that electrically connect the transistor to the bit line, the first lower bonding pad and the first upper bonding pad being in contact with each other;

a second lower bonding pad and a second upper bonding pad that electrically connect the transistor to the connection conductive structure, the second lower bonding pad and the second upper bonding pad being in contact with each other; and a through via that electrically connects the second upper bonding pad to the connection conductive structure, the through via penetrating the upper substrate.

* * * * *